(12) United States Patent
Hung et al.

(10) Patent No.: US 12,444,934 B2
(45) Date of Patent: Oct. 14, 2025

(54) ELECTROSTATIC DISCHARGE (ESD) PROTECTION CIRCUIT AND METHOD OF OPERATING THE SAME

(71) Applicant: TAIWAN SEMICONDUCTOR MANUFACTURING COMPANY, LTD., Hsinchu (TW)

(72) Inventors: Tao Yi Hung, Hsinchu (TW); Ming-Fang Lai, Hsinchu (TW); Li-Wei Chu, Hsinchu (TW); Wun-Jie Lin, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/108,497

(22) Filed: Dec. 1, 2020

(65) Prior Publication Data

US 2021/0305809 A1    Sep. 30, 2021

Related U.S. Application Data

(60) Provisional application No. 63/003,024, filed on Mar. 31, 2020.

(51) Int. Cl.

| | |
|---|---|
| *H02H 9/04* | (2006.01) |
| *H02H 1/00* | (2006.01) |
| *H10D 84/01* | (2025.01) |
| *H10D 84/03* | (2025.01) |
| *H10D 89/60* | (2025.01) |

(52) U.S. Cl.
CPC ........ *H02H 9/046* (2013.01); *H10D 84/0149* (2025.01); *H10D 84/038* (2025.01); *H10D 89/611* (2025.01); *H10D 89/817* (2025.01); *H10D 89/911* (2025.01); *H10D 89/921* (2025.01); *H02H 1/0007* (2013.01)

(58) Field of Classification Search
CPC .................. H02H 9/046; H02H 1/0007; H01L 21/823475; H01L 27/0255; H01L 27/0281; H01L 27/0288; H01L 27/0292; H01L 27/0629; H01L 27/0266; H03K 19/00315
USPC .......................................... 361/56
See application file for complete search history.

(56) References Cited

U.S. PATENT DOCUMENTS

| | | | | |
|---|---|---|---|---|
| 3,462,650 | A | * 8/1969 | Hans-Jurgen | .......... H10D 99/00 257/E21.573 |
| 4,624,004 | A | * 11/1986 | Calviello | ............. H10D 64/254 257/284 |
| 2008/0277729 | A1 | 11/2008 | Gossner et al. | |

(Continued)

OTHER PUBLICATIONS

Office Action dated Sep. 27, 2021 for corresponding case No. TW 11020933400 (pp. 1-5).

*Primary Examiner* — Sreeya Sreevatsa
(74) *Attorney, Agent, or Firm* — Hauptman Ham, LLP

(57) ABSTRACT

A clamp circuit includes an electrostatic discharge (ESD) detection circuit coupled between a first node and a second node. The clamp circuit further includes a first transistor of a first type. The first transistor has a first gate coupled to at least the ESD detection circuit by a third node, a first drain coupled to the first node and a first source coupled to the second node. The clamp circuit further includes a charging circuit coupled between the second node and the third node, and configured to charge the third node during an ESD event at the second node.

20 Claims, 10 Drawing Sheets

(56) References Cited

U.S. PATENT DOCUMENTS

| | | | |
|---|---|---|---|
| 2010/0252934 A1* | 10/2010 | Law | H01L 21/76898 |
| | | | 257/E21.597 |
| 2013/0215541 A1* | 8/2013 | Karp | H03K 19/00346 |
| | | | 361/56 |
| 2013/0229736 A1 | 9/2013 | Van Der Borght et al. | |
| 2013/0242449 A1 | 9/2013 | Kato et al. | |
| 2014/0368958 A1 | 12/2014 | Ikimura | |
| 2015/0357477 A1* | 12/2015 | Zhang | H10D 64/256 |
| | | | 257/296 |
| 2016/0172850 A1* | 6/2016 | Ellis-Monaghan | H02H 9/046 |
| | | | 361/56 |
| 2017/0025349 A1* | 1/2017 | Wood | H01L 23/5226 |
| 2017/0063080 A1 | 3/2017 | Ikeda | |
| 2018/0145030 A1* | 5/2018 | Beyne | H01L 21/76251 |
| 2019/0115339 A1* | 4/2019 | Lai | H10D 30/4755 |
| 2019/0260203 A1 | 8/2019 | Seidl et al. | |
| 2019/0319453 A1 | 10/2019 | Sithanandam et al. | |
| 2020/0373242 A1* | 11/2020 | Hiblot | H10D 30/021 |

\* cited by examiner

ELECTROSTATIC DISCHARGE (ESD) PROTECTION CIRCUIT AND METHOD OF OPERATING THE SAME

PRIORITY CLAIM AND CROSS-REFERENCE

This application claims the benefit of U.S. Provisional Application No. 63/003,024, filed Mar. 31, 2020, which is herein incorporated by reference in its entirety.

BACKGROUND

The recent trend in miniaturizing integrated circuits (ICs) has resulted in smaller devices which consume less power, yet provide more functionally at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
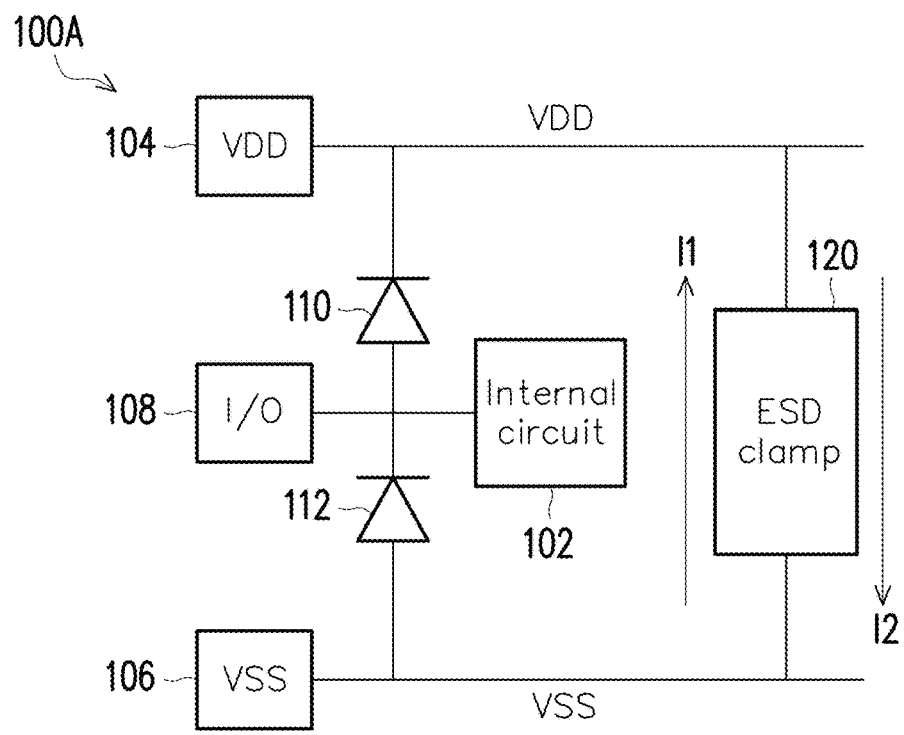
FIG. 1A is a schematic block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a clamp circuit includes an electrostatic discharge (ESD) detection circuit coupled between a first node and a second node. In some embodiments, the clamp circuit further includes a first transistor of a first type. The first transistor has a first gate coupled to at least the ESD detection circuit by a third node, a first drain coupled to the first node and a first source coupled to the second node.

In some embodiments, the clamp circuit further includes a charging circuit coupled between the second node and the third node, and configured to charge the third node during an ESD event at the second node. In some embodiments, the clamp circuit is formed in a substrate. In some embodiments, a bulk of the substrate has been removed during wafer thinning, thereby reducing the effectiveness of a body diode in the substrate for ESD events.

During an ESD event at the first node of the present disclosure, the clamp circuit is turned on such that a channel of the clamp circuit 120 is used to discharge the ESD current in a forward ESD direction from the first node to the second node, in accordance with some embodiments. In comparison with other approaches that utilize the body diode to reduce the ESD event in the forward ESD direction, or to other approaches that have the bulk removed during manufacturing (e.g., bulk-less process), the integrated circuit of the present disclosure has better ESD discharging capability and performance than other approaches while occupying less area.

FIG. 1A is a schematic block diagram of an integrated circuit 100A, in accordance with some embodiments.

Integrated circuit 100A comprises an internal circuit 102, a voltage supply node 104, a reference voltage supply node 106, an input/output (IO) pad 108, a diode 110, a diode 112 and an ESD clamp 120. In some embodiments, at least integrated circuit 100A, 100B (FIG. 1B), 200A-200B (FIGS. 2A-2B), 300A-300B (FIGS. 3A-3B), 400A-400C (FIGS. 4A-4C) or 500A-500C (FIGS. 5A-5C) is incorporated on a single integrated circuit (IC), or on a single semiconductor substrate. In some embodiments, at least integrated circuit 100A, 100B (FIG. 1B), 200A-200B (FIGS. 2A-2B), 300A-300B (FIGS. 3A-3B), 400A-400C (FIGS. 4A-4C) or 500A-

500C (FIGS. 5A-5C) includes one or more ICs incorporated on one or more single semiconductor substrates.

Internal circuit 102 is coupled to the IO pad 108, diode 110 and diode 112. Internal circuit 102 is configured to receive an IO signal from IO pad 108. In some embodiments, internal circuit 102 is coupled to voltage supply node 104 (e.g. VDD) and reference voltage supply node 106 (e.g., VSS). In some embodiments, internal circuit 102 is configured to receive a supply voltage VDD from voltage supply node 104 (e.g. VDD), and a reference voltage VSS from reference voltage supply node 106 (e.g., VSS).

Internal circuit 102 includes circuitry configured to generate or process the IO signal received by or output to IO pad 108. In some embodiments, internal circuit 102 comprises core circuitry configured to operate at a voltage lower than supply voltage VDD of voltage supply node 104. In some embodiments, internal circuit 102 includes at least one n-type or p-type transistor device. In some embodiments, internal circuit 102 includes at least a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, internal circuit 102 includes at least a memory cell. In some embodiments, the memory cell includes a static random access memory (SRAM), a dynamic RAM (DRAM), a resistive RAM (RRAM), a magnetoresistive RAM (MRAM) or read only memory (ROM). In some embodiments, internal circuit 102 includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain. Examples of passive elements include, but are not limited to, capacitors, inductors, fuses, and resistors.

Voltage supply node 104 is coupled to diode 110 and ESD clamp 120. Reference voltage supply node 106 is coupled to diode 112 and ESD clamp 120. Voltage supply node 104 is configured to receive supply voltage VDD for normal operation of internal circuit 102. Similarly, reference voltage supply node 106 is configured to receive reference supply voltage VSS for normal operation of internal circuit 102. In some embodiments, at least voltage supply node 104 is a voltage supply pad. In some embodiments, at least reference voltage supply node 106 is a reference voltage supply pad. In some embodiments, a pad is at least a conductive surface, a pin, a node or a bus. Voltage supply node 104 or reference voltage supply node 106 is also referred to as a power supply voltage bus or rail. In the example configuration in FIG. 1A-1B, 2A-2B, 3A-3B, 4A-4C or 5A-5C, supply voltage VDD is a positive supply voltage, voltage supply node 104 is a positive power supply voltage, reference supply voltage VSS is a ground supply voltage, and reference voltage supply node 106 is a ground voltage terminal. Other power supply arrangements are within the scope of the present disclosure.

IO pad 108 is coupled to internal circuit 102. IO pad 108 is configured to receive IO signal from internal circuit 102 or configured to output IO signal to internal circuit 102. IO pad 108 is at least a pin that is coupled to internal circuit 102. In some embodiments, IO pad 108 is a node, a bus or a conductive surface that is coupled to internal circuit 102.

Diode 110 is coupled between voltage supply node 104 and IO pad 108. An anode of diode 110 is coupled to internal circuit 102, IO pad 108 and a cathode of diode 112. A cathode of diode 110 is coupled to voltage supply node 104 and ESD clamp 120. In some embodiments, diode 110 is a pull-up diode or referred to as a p+ diode. For example, in these embodiments, the p+-diode is formed between a p-well region (not shown) and an n-well region (not shown), and the n-well region is connected to VDD.

Diode 112 is coupled between reference voltage supply node 106 and IO pad 108. An anode of diode 112 is coupled to reference voltage supply node 106 and ESD clamp 120. A cathode of diode 112 is coupled to internal circuit 102, IO pad 108 and the anode of diode 110. In some embodiments, diode 112 is a pull-down diode or referred to as an n+ diode. For example, in these embodiments, the n+-diode is formed between an n+ junction (not shown) and a p-substrate (not shown), and the P-substrate is connected to ground or VSS.

Diodes 110 and 112 are configured to have a minimal impact on the normal behavior (e.g., no ESD conditions or events) of internal circuit 102 or integrated circuit 100A. In some embodiments, an ESD event occurs when an ESD voltage or current higher than a level of voltage or current expected during the normal operation of internal circuit 102 is applied to at least voltage supply node 104, reference voltage supply node 106 or IO pad 108.

When no ESD events occur, diodes 110 and 112 do not affect the operation of integrated circuit 100A. During an ESD event, diode 110 is configured to transfer voltage or current between voltage supply node 104 and IO pad 108 dependent upon whether diode 110 is forward biased or reverse biased, and the voltage levels of the voltage supply node 104 and IO pad 108.

For example, during a Positive-to-VDD (PD) mode of ESD stress or event, diode 110 is forward biased and is configured to transfer voltage or current from IO pad 108 to voltage supply node 104. In PD-mode, a positive ESD stress or ESD voltage (at least greater than supply voltage VDD) is applied to IO pad 108, while voltage supply node 104 (e.g., VDD) is ground and reference voltage supply node 106 (e.g., VSS) is floating.

For example, during a Negative-to-VDD (ND) mode of ESD stress or event, diode 110 is reverse biased and is configured to transfer voltage or current from voltage supply node 104 to IO pad 108. In ND-mode, a negative ESD stress is received by IO pad 108, while the voltage supply node 104 (e.g., VDD) is ground and reference voltage supply node 106 (e.g., VSS) is floating.

During an ESD event, diode 112 is configured to transfer voltage or current between reference voltage supply node 106 and IO pad 108 dependent upon whether diode 112 is forward biased or reverse biased, and the voltage levels of the reference voltage supply node 106 and IO pad 108.

For example, during a Positive-to-VSS (PS) mode of ESD stress or event, diode 112 is reverse biased and is configured to transfer voltage or current from IO pad 108 to reference voltage supply node 106. In PS-mode, a positive ESD stress or ESD voltage (at least greater than reference supply voltage VSS) is applied to IO pad 108, while voltage supply node 104 (e.g., VDD) is floating and reference voltage supply node 106 (e.g., VSS) is ground.

For example, during a Negative-to-VSS (NS) mode of ESD stress or event, diode 112 is forward biased and is configured to transfer voltage or current from reference voltage supply node 106 to IO pad 108. In NS-mode, a negative ESD stress is received by IO pad 108, while the voltage supply node 104 (e.g., VDD) is floating and reference voltage supply node 106 (e.g., VSS) is ground.

Other types of diodes, configurations and arrangements of at least diode 110 or 112 are within the scope of the present disclosure.

ESD clamp 120 is coupled between voltage supply node 104 (e.g. supply voltage VDD) and reference voltage supply node 106 (e.g., VSS). When no ESD event occurs, ESD clamp 120 is turned off. For example, when no ESD event occurs, ESD clamp 120 is turned off, and is therefore a nonconductive device or circuit during the normal operation of internal circuit 102. In other words, ESD clamp 120 is turned off or is non-conductive in the absence of an ESD event.

If an ESD event occurs, ESD clamp 120 is configured to sense the ESD event, and is configured to turn on and provide a current shunt path between voltage supply node 104 (e.g. supply voltage VDD) and reference voltage supply node 106 (e.g., VSS) to thereby discharge the ESD current. For example, when an ESD event occurs, the voltage difference across the ESD clamp 120 is equal to or greater than a threshold voltage of ESD clamp 120, and ESD clamp 120 is turned ON thereby conducting current between voltage supply node 104 (e.g. VDD) and reference voltage supply node 106 (e.g., VSS).

During an ESD event, ESD clamp 120 is configured to turn on and discharge an ESD current (I1 or I2) in a forward ESD direction (e.g., current I1) or a reverse ESD direction (e.g., current I2). The forward ESD direction (e.g., current I1) is from the reference voltage supply node 106 (e.g., VSS) to the voltage supply node 104 (e.g. VDD). The reverse ESD direction (e.g., current I2) is from voltage supply node 104 (e.g. VDD) to reference voltage supply node 106 (e.g., VSS).

During a positive ESD surge on reference voltage supply node 106, ESD clamp 120 is configured to turn on and discharge the ESD current I1 in a forward ESD direction from the reference voltage supply node 106 (e.g., VSS) to the voltage supply node 104 (e.g. VDD). In some embodiments, ESD clamp 120 is configured to turn on, after a PS mode (described above) of ESD, and discharge the ESD current I1 in the forward ESD direction from the reference voltage supply node 106 (e.g., VSS) to the voltage supply node 104 (e.g. VDD).

During a positive ESD surge on voltage supply node 104, ESD clamp 120 is configured to turn on and discharge the ESD current I2 in a reverse ESD direction from voltage supply node 104 (e.g. VDD) to reference voltage supply node 106 (e.g., VSS). In some embodiments, ESD clamp 120 is configured to turn on, after a PD mode (described above) of ESD, and discharge the ESD current I2 in the reverse ESD direction from voltage supply node 104 (e.g. VDD) to reference voltage supply node 106 (e.g., VSS).

In some embodiments, ESD clamp 120 is a transient clamp. For example, in some embodiments, ESD clamp 120 is configured to handle transient or rapid ESD events, e.g., rapid changes in voltage and/or current from the ESD event. During the transient or rapid ESD, the ESD clamp 120 is configured to turn on very quickly to provide a shunt path between voltage supply node 104 (e.g. supply voltage VDD) and reference voltage supply node 106 (e.g., VSS) before the ESD event can cause damage to one or more elements within integrated circuit 100A or 100B. In some embodiments, ESD clamp 120 is configured to turn off slower than it turns on.

In some embodiments, ESD clamp 120 is a static clamp. In some embodiments, static clamps are configured to provide a static or steady-state voltage and current response. For example, static clamps are turned-on by a fixed voltage level.

In some embodiments, ESD clamp 120 includes a large NMOS transistor configured to carry the ESD current without entering the avalanche breakdown region of the ESD clamp 120. In some embodiments, ESD clamp 120 is implemented without having avalanching junctions inside ESD clamp 120, and is also known as a "non-snapback protection scheme."

Other types of clamp circuits, configurations and arrangements of ESD clamp 120 are within the scope of the present disclosure.

Other configurations or quantities of circuits in integrated circuit 100A are within the scope of the present disclosure.

In some embodiments, during an ESD event at reference supply voltage node 106, the clamp circuit 120 is turned on such that a channel of the clamp circuit 120 is used to discharge the ESD current I1 or I3 in the forward ESD direction from reference voltage supply node 106 to voltage supply node 104. In comparison with other approaches that utilize a body diode to reduce the ESD event in the forward ESD direction, or to other approaches that have the bulk removed during manufacturing (e.g., bulk-less process), integrated circuit 100A has better ESD discharging capability and performance than other approaches while occupying less area.

Figure 1B:
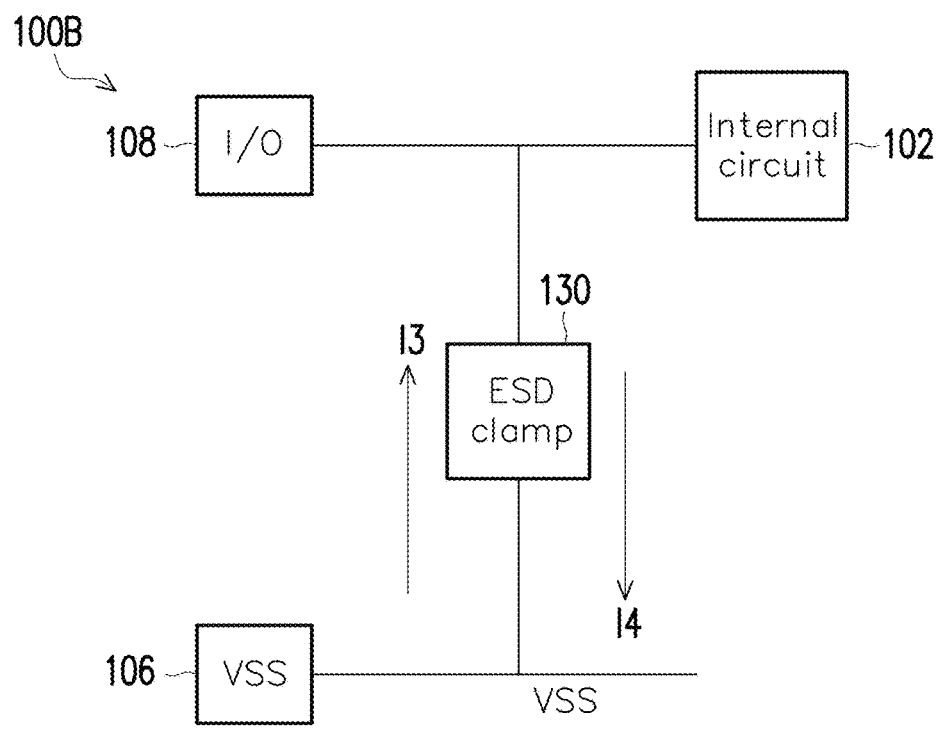
FIG. 1B is a schematic block diagram of an integrated circuit, in accordance with some embodiments.

FIG. 1B is a schematic block diagram of an integrated circuit 100B, in accordance with some embodiments.

Integrated circuit 100B is a variation of integrated circuit 100A, and similar detailed description is therefore omitted. For example, integrated circuit 100B includes an ESD clamp 130, similar to ESD clamp 120 of FIG. 1A, coupled between IO pad 108 and reference voltage supply node 106 (e.g., VSS), in accordance with some embodiments. While integrated circuit 100B of FIG. 1B shows a portion of integrated circuit 100A, it is understood that integrated circuit 100B can be modified to include each of the features of integrated circuit 100A, and similar detailed description is therefore omitted for brevity.

Components that are the same or similar to those in one or more of FIGS. 1A-1B, 2A-2B, 3A-3B, 4A-4C, 5A-5C and 6 (shown below) are given the same reference numbers, and detailed description thereof is thus omitted.

Integrated circuit 100B includes internal circuit 102, reference voltage supply node 106, IO pad 108 and ESD clamp 130.

ESD clamp 130 is similar to ESD clamp 120, and similar detailed description is therefore omitted. In comparison with ESD clamp 120 of FIG. 1A, ESD clamp 130 is coupled to internal circuit 102, IO pad 108 and reference voltage supply node 106 (e.g., VSS).

During an ESD event, ESD clamp 130 is configured to turn on and discharge an ESD current (I3 or I4) in a forward ESD direction (e.g., current I3) or a reverse ESD direction (e.g., current I4). The forward ESD direction (e.g., current I3) is from the reference voltage supply node 106 (e.g., VSS) to the IO pad 108. The reverse ESD direction (e.g., current I4) is from IO pad 108 to reference voltage supply node 106 (e.g., VSS).

During a positive ESD surge on reference voltage supply node 106, ESD clamp 130 is configured to turn on and discharge the ESD current I3 in the forward ESD direction from the reference voltage supply node 106 (e.g., VSS) to the IO pad 108.

During a positive ESD surge on IO pad 108, ESD clamp 130 is configured to turn on and discharge the ESD current I4 in a reverse ESD direction from IO pad 108 to reference voltage supply node 106 (e.g., VSS).

Other types of clamp circuits, configurations and arrangements of ESD clamp 130 are within the scope of the present disclosure.

Other configurations or quantities of circuits in integrated circuit 100B are within the scope of the present disclosure.

In some embodiments, during an ESD event at reference supply voltage node 106, the clamp circuit 130 is turned on such that a channel of the clamp circuit 130 is used to discharge the ESD current I1 or I3 in the forward ESD direction from reference voltage supply node 106 to IO pad 108. In comparison with other approaches that utilize a body diode to reduce the ESD event in the forward ESD direction, or to other approaches that have the bulk removed during manufacturing (e.g., bulk-less process), integrated circuit 100B has better ESD discharging capability and performance than other approaches while occupying less area.

Figure 2A:
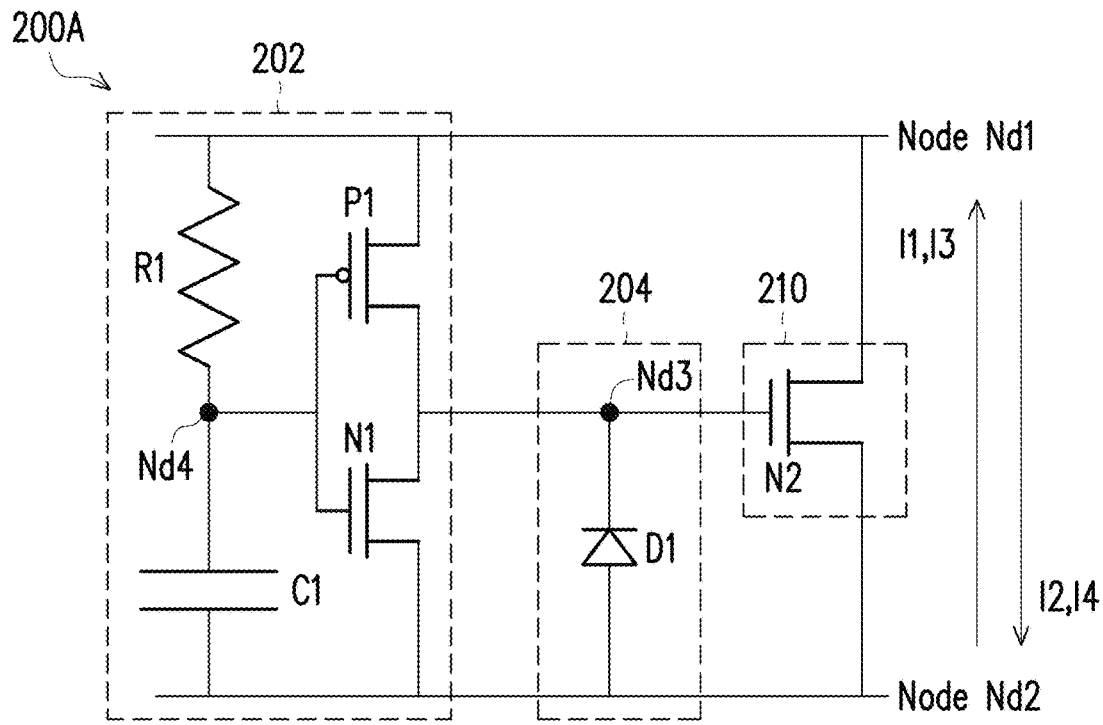
FIG. 2A is a circuit diagram of an integrated circuit, in accordance with some embodiments.

FIG. 2A is a circuit diagram of an integrated circuit 200A, in accordance with some embodiments.

Integrated circuit 200A is an embodiment of at least ESD clamp 120 or 130, and similar detailed description is therefore omitted.

Node Nd1 in FIGS. 2A-2B, 3A-3B, 4A-4C & 5A-5C corresponds to voltage supply node 104 of FIG. 1A or IO node 108 of FIG. 1B. Node Nd2 of FIGS. 2A-2B, 3A-3B, 4A-4C & 5A-5C corresponds to reference voltage supply node 106 of FIGS. 1A-1B.

Integrated circuit 200A includes an ESD detection circuit 202, a charging circuit 204 and a discharging circuit 210.

ESD detection circuit 202 is coupled to charging circuit 204, discharging circuit 210 and a node Nd3. ESD detection circuit 202 is further coupled between node Nd1 and node Nd2. ESD detection circuit 202 is configured to detect an ESD event at node Nd1 (e.g., an ESD current I2 or I4 in the reverse ESD direction), and to charge node Nd3 in response to the ESD event, thereby turning on discharging circuit 210. In some embodiments, in response to being turned on, discharging circuit 210 couples node Nd1 and Nd2 thereby providing an ESD discharge path between node Nd1 and Nd2.

Charging circuit 204 is coupled to node Nd2, node Nd3, ESD detection circuit 202 and discharging circuit 210. Charging circuit 204 is configured to detect an ESD event at node Nd2 (e.g., an ESD current I1 or I3 in the forward ESD direction), and to charge node Nd3 in response to the ESD event thereby turning on discharging circuit 210. In some embodiments, in response to being turned on, discharging circuit 210 couples node Nd2 and Nd1 thereby providing an ESD discharge path between node Nd2 and Nd1.

Discharging circuit 210 is coupled between node Nd1 and node Nd2. Discharging circuit 210 is further coupled to node Nd3, ESD detection circuit 202 and charging circuit 204. Discharging circuit 210 is configured to couple node Nd1 and Nd2 during an ESD event at node Nd1 or node Nd2, thereby providing an ESD discharge path between node Nd1 and Nd2.

ESD detection circuit 202 includes a resistor R1, a capacitor C1, an N-type Metal Oxide Semiconductor (NMOS) transistor N1 and a P-type Metal Oxide Semiconductor (PMOS) transistor P1.

Charging circuit 204 includes a diode D1.

Discharging circuit 210 includes an NMOS transistor N2.

Each of a first end of resistor R1, node Nd1, a source of PMOS transistor P1, and a drain of NMOS transistor N2 are coupled together. Each of a second end of resistor R1, node Nd4, a first end of capacitor C1, a gate of PMOS transistor P1, and a gate of NMOS transistor N2 are coupled together.

Each of a second end of capacitor C1, node Nd2, a source of NMOS transistor N1, a source of NMOS transistor N2 and an anode of a diode D1 of charging circuit 204 are coupled together.

Each of a node Nd3, a drain of NMOS transistor N1, a drain of PMOS transistor P1, a cathode of diode D1 and a gate of NMOS transistor N2 are coupled together.

In some embodiments, capacitor C1 is a transistor-coupled capacitor. For example in some embodiments, capacitor C1 is a transistor having a drain and source coupled together thereby forming a transistor-coupled capacitor.

Resistor R1 and capacitor C1 are configured as an RC network. Dependent upon a location of an output of the RC network, the RC network is configured as either a low pass filter or a high pass filter.

NMOS transistor N1 and PMOS transistor P1 are configured as an inverter (not labelled). Thus, a slowly rising voltage at node Nd4 will be inverted by NMOS transistor N1 and PMOS transistor P1 (e.g., an inverter) thereby causing node Nd3 to rapidly rise. Furthermore, a rapidly rising voltage at node Nd4 will be inverted by NMOS transistor N1 and PMOS transistor P1 (e.g., an inverter) thereby causing node Nd3 to rise slowly. In some embodiments, NMOS transistor N1 and PMOS transistor P1 are configured to generate an inverted input signal (not shown) in response to an input signal (not shown).

When an ESD event at node Nd1 occurs (e.g., ESD current I2 or I4 in the reverse ESD direction), the ESD current or voltage at node Nd1 rises rapidly causing the voltage of node Nd4 (e.g., across capacitor C1) to rise slowly (e.g., slower than rapidly) since the voltage at node Nd4 corresponds to an output voltage of a low pass filter (e.g., a voltage across capacitor C1 with respect to node ND2). In other words, capacitor C1 is configured as a low pass filter, and the rapidly changing voltage or current from the ESD event is filtered by capacitor C1. In response to the slowly rising voltage at node Nd4, PMOS transistor P1 will turn on thereby coupling node Nd3 to node Nd1 and causing node Nd1 to rapidly rise from the ESD event at node Nd1. Thus, ESD detection circuit 202 couples node Nd1 to node Nd3 and thereby charges node Nd3 and the gate of NMOS transistor N2 of the discharging circuit 210. In response to being charged by ESD detection circuit 202, NMOS transistor N2 of discharging circuit 210 is turned on and couples node Nd1 to node Nd2. By being turned on and coupling node Nd1 to node Nd2, the channel of NMOS transistor N2 discharges the ESD current I2 or I4 in the reverse ESD direction from node Nd1 to Nd2.

Charging circuit 204 has a minimal effect on an ESD event at node Nd1. For example, in some embodiments, when an ESD event at node Nd1 occurs, diode D1 is reverse biased and is therefore turned off.

When an ESD event at node Nd2 occurs (e.g., ESD current I1 or I3 flows in the forward ESD direction), the ESD current or voltage at node Nd2 rises rapidly, and charging circuit 204 detects the rapidly rising current or voltage at node Nd2 of the ESD event, causing diode D1 of the charging circuit 204 to become forward biased. In response to becoming forward biased, diode D1 couples node Nd2 to node Nd3 and thereby charges node Nd3 and the gate of NMOS transistor N2 of the discharging circuit 210 in response to the rising ESD voltage or current. In response to being charged by diode D1 of charging circuit 204, NMOS transistor N2 of discharging circuit 210 is turned on and couples node Nd2 to node Nd1. By being turned on and coupling node Nd2 to node Nd1, the channel of NMOS transistor N2 discharges the ESD current I1 or I3 in the forward ESD direction from node Nd2 to Nd1.

ESD detection circuit 202 has a minimal effect on an ESD event at node Nd2. For example, in some embodiments, when an ESD event at node Nd2 occurs, the rapidly rising ESD current or voltage at node Nd2 causes the voltage of node Nd4 (e.g., across capacitor C1) to rise as well. However, a rising voltage at node Nd4 will be inverted by NMOS transistor N1 and PMOS transistor P1 (e.g., an inverter) thereby causing node Nd3 to not rise from the ESD detection circuit 202. In other words, ESD detection circuit 202 has a minimal effect on an ESD event at node Nd2.

By using diode D1 of charging circuit 204 to trigger or turn on the NMOS transistor N1 during an ESD event at node Nd2, the channel of NMOS transistor N1 is used to discharge the ESD current I1 or I3 in the forward ESD direction from node Nd2 to Nd1. In comparison with other approaches that utilize a body diode to reduce the ESD event in the forward ESD direction, or to other approaches that have the bulk removed during manufacturing (e.g., bulk-less process), integrated circuit 200A, 300A (FIG. 3A), 400A (FIG. 4A) or 500A (FIG. 5A) has better ESD discharging capability and performance than other approaches.

Other types of circuits, configurations and arrangements of at least ESD detection circuit 202, charging circuit 204 or discharging circuit 210 are within the scope of the present disclosure.

Other configurations or quantities of circuits in integrated circuit 200A are within the scope of the present disclosure.

Figure 2B:
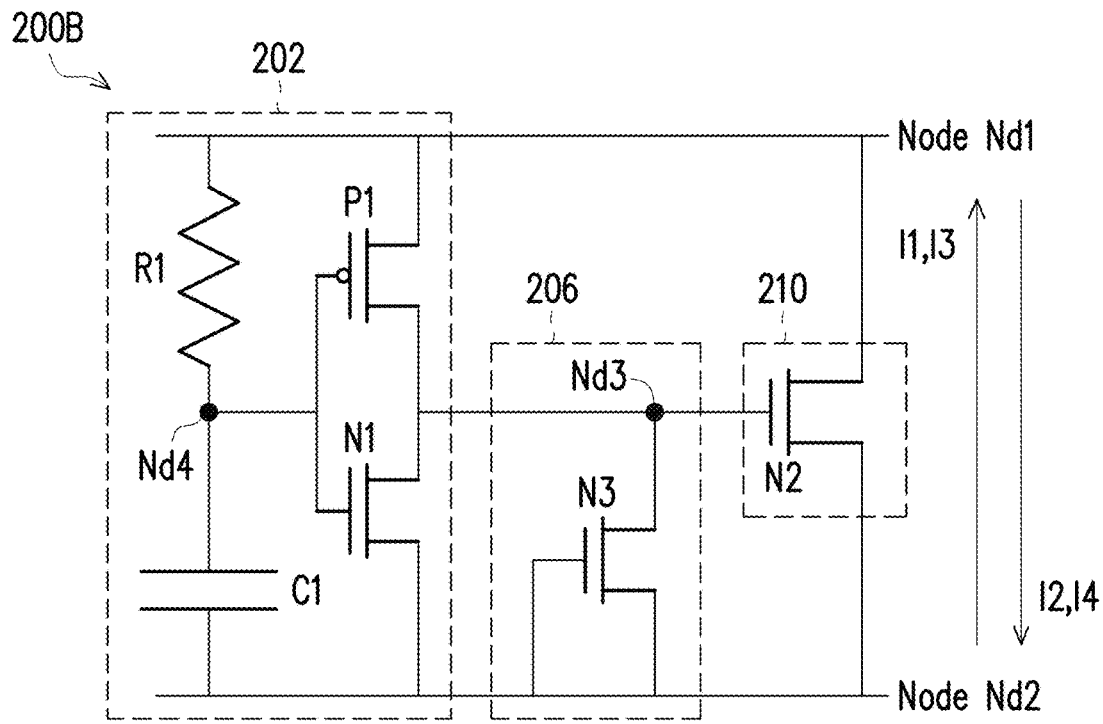
FIG. 2B is a circuit diagram of an integrated circuit, in accordance with some embodiments.

FIG. 2B is a circuit diagram of an integrated circuit 200B, in accordance with some embodiments.

Integrated circuit 200B is an embodiment of at least ESD clamp 120 or 130, and similar detailed description is therefore omitted.

Integrated circuit 200B is a variation of integrated circuit 200A of FIG. 2A, and similar detailed description is therefore omitted. In comparison with integrated circuit 200A, charging circuit 206 of integrated circuit 200B replaces charging circuit 204 of integrated circuit 200A, and similar detailed description is therefore omitted.

Integrated circuit 200B includes ESD detection circuit 202, charging circuit 206 and discharging circuit 210.

Charging circuit 206 is a variation of charging circuit 204 of FIG. 2A, and similar detailed description is therefore omitted. In comparison with charging circuit 204, an NMOS transistor N3 of charging circuit 206 replaces diode D1 of charging circuit 204, and similar detailed description is therefore omitted.

Charging circuit 206 includes NMOS transistor N3. NMOS transistor N3 is a grounded gate NMOS (ggNMOS) transistor. NMOS transistor N3 includes a gate, a drain and a source (not labelled).

Each of the gate of NMOS transistor N3, the source of NMOS transistor N3, the second end of capacitor C1, node Nd2, the source of NMOS transistor N1 and the source of NMOS transistor N2 are coupled together.

Each of the drain of NMOS transistor N3, node Nd3, the drain of NMOS transistor N1, the drain of PMOS transistor P1 and the gate of NMOS transistor N2 are coupled together.

When an ESD event at node Nd2 occurs (e.g., ESD current I1 or I3 flows in the forward ESD direction), the ESD current or voltage at node Nd2 rises rapidly, and charging circuit 204 detects the rapidly rising current or voltage at node Nd2 of the ESD event, causing NMOS transistor N3 of the charging circuit 206 to turn on. In response to turning on, NMOS transistor N3 couples node Nd2 to node Nd3 and thereby charges node Nd3 and the gate of NMOS transistor N2 of the discharging circuit 210 in response to the rising ESD voltage or current. In response to being charged by NMOS transistor N3 of charging circuit 206, NMOS transistor N2 of discharging circuit 210 is turned on and couples node Nd2 to node Nd1. By being turned on and coupling node Nd2 to node Nd1, the channel of NMOS transistor N2 discharges the ESD current I1 or I3 in the forward ESD direction from node Nd2 to Nd1.

Charging circuit 206 has a minimal effect on an ESD event at node Nd1. For example, in some embodiments, when an ESD event at node Nd1 occurs, NMOS transistor N3 is turned off.

ESD detection circuit 302 has a minimal effect on an ESD event at node Nd2.

By using NMOS transistor N3 of charging circuit 206 to trigger or turn on the NMOS transistor N1 during an ESD event at node Nd2, the channel of NMOS transistor N1 is used to discharge the ESD current I1 or I3 in the forward ESD direction from node Nd2 to Nd1. In comparison with other approaches that utilize a body diode to reduce the ESD event in the forward ESD direction, or to other approaches that have the bulk removed during manufacturing (e.g., bulk-less process), integrated circuit 200B, 300B (FIG. 3B), 400B (FIG. 4B) or 500B (FIG. 5B) has better ESD discharging capability and performance than other approaches.

Other types of circuits, configurations and arrangements of at least ESD detection circuit 202, charging circuit 206 or discharging circuit 210 are within the scope of the present disclosure.

Other configurations or quantities of circuits in integrated circuit 200B are within the scope of the present disclosure.

Figure 3A:
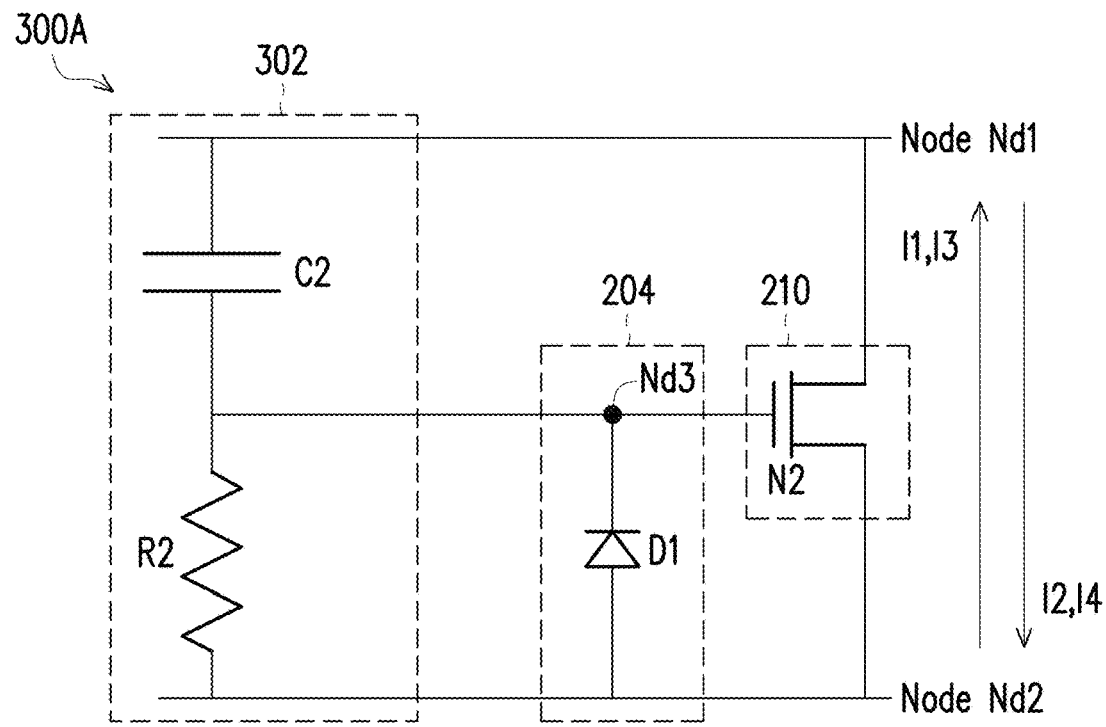
FIG. 3A is a circuit diagram of an integrated circuit, in accordance with some embodiments.

FIG. 3A is a circuit diagram of an integrated circuit 300A, in accordance with some embodiments.

Integrated circuit 300A is an embodiment of at least ESD clamp 120 or 130, and similar detailed description is therefore omitted.

Integrated circuit 300A is a variation of integrated circuit 200A of FIG. 2A, and similar detailed description is therefore omitted. In comparison with integrated circuit 200A, ESD detection circuit 302 of integrated circuit 300A replaces ESD detection circuit 202 of integrated circuit 200A, and similar detailed description is therefore omitted.

Integrated circuit 300A includes ESD detection circuit 302, charging circuit 204 and discharging circuit 210.

ESD detection circuit 302 is a variation of ESD detection circuit 202 of FIG. 2A, and similar detailed description is therefore omitted. In comparison with ESD detection circuit 202, ESD detection circuit 302 is a high pass filter compared with the low pass filter of ESD detection circuit 202 of FIG. 2A. In comparison with ESD detection circuit 202, ESD detection circuit 302 does not include NMOS transistor N1 and PMOS transistor P1.

In comparison with ESD detection circuit 202, a resistor R2 of ESD detection circuit 302 replaces resistor R1 of ESD detection circuit 202, a capacitor C2 of ESD detection circuit 302 replaces capacitor C1 of ESD detection circuit 202, and locations of resistor R2 and capacitor C2 are flipped with locations of resistor R1 and capacitor C1, and similar detailed description is therefore omitted.

ESD detection circuit 302 includes resistor R2 and capacitor C2.

Each of a first end of capacitor C2, node Nd1, and the drain of NMOS transistor N2 are coupled together.

Each of a second end of capacitor C2, node N3, a first end of resistor R2, the gate of NMOS transistor N2, and the cathode of diode D1 are coupled together.

Each of a second end of resistor R2, node Nd2, the source of NMOS transistor N2 and the anode of diode D1 of charging circuit 204 are coupled together.

When an ESD event at node Nd1 occurs (e.g., ESD current I2 or I4 in the reverse ESD direction), the ESD current or voltage at node Nd1 rises rapidly causing the voltage of node Nd3 (e.g., across resistor R2) to rise rapidly since the voltage at node Nd3 corresponds to an output voltage of a high pass filter (e.g., a voltage across resistor R2 with respect to node ND2). In other words, resistor R2 is configured as a high pass filter, and the rapidly changing voltage or current from the ESD event is not filtered or is passed by resistor R2. In response to the rapidly rising voltage at node Nd3, node Nd3 and the gate of NMOS transistor N2 of the discharging circuit 210 is charged by ESD detection circuit 302. In response to being charged by ESD detection circuit 302, NMOS transistor N2 of discharging circuit 210 is turned on and couples node Nd1 to node Nd2. By being turned on and coupling node Nd1 to node Nd2, the channel of NMOS transistor N2 discharges the ESD current I2 or I4 in the reverse ESD direction from node Nd1 to Nd2.

Charging circuit 204 has a minimal effect on an ESD event at node Nd1. For example, in some embodiments, when an ESD event at node Nd1 occurs, diode d1 is reverse biased and is therefore turned off. ESD detection circuit 302 has a minimal effect on an ESD event at node Nd2.

The description for when an ESD event occurs at node Nd2 (e.g., ESD current I1 or I3 in the forward ESD direction) with charging circuit 204 for FIG. 3A is similar to the description of when an ESD event occurs at node Nd2 for charging circuit 204 of FIG. 2A, and similar detailed description is therefore omitted for brevity.

ESD detection circuit 302 has a minimal effect on an ESD event at node Nd2.

Other types of circuits, configurations and arrangements of at least ESD detection circuit 302, charging circuit 204 or discharging circuit 210 are within the scope of the present disclosure.

Other configurations or quantities of circuits in integrated circuit 300A are within the scope of the present disclosure.

Figure 3B:
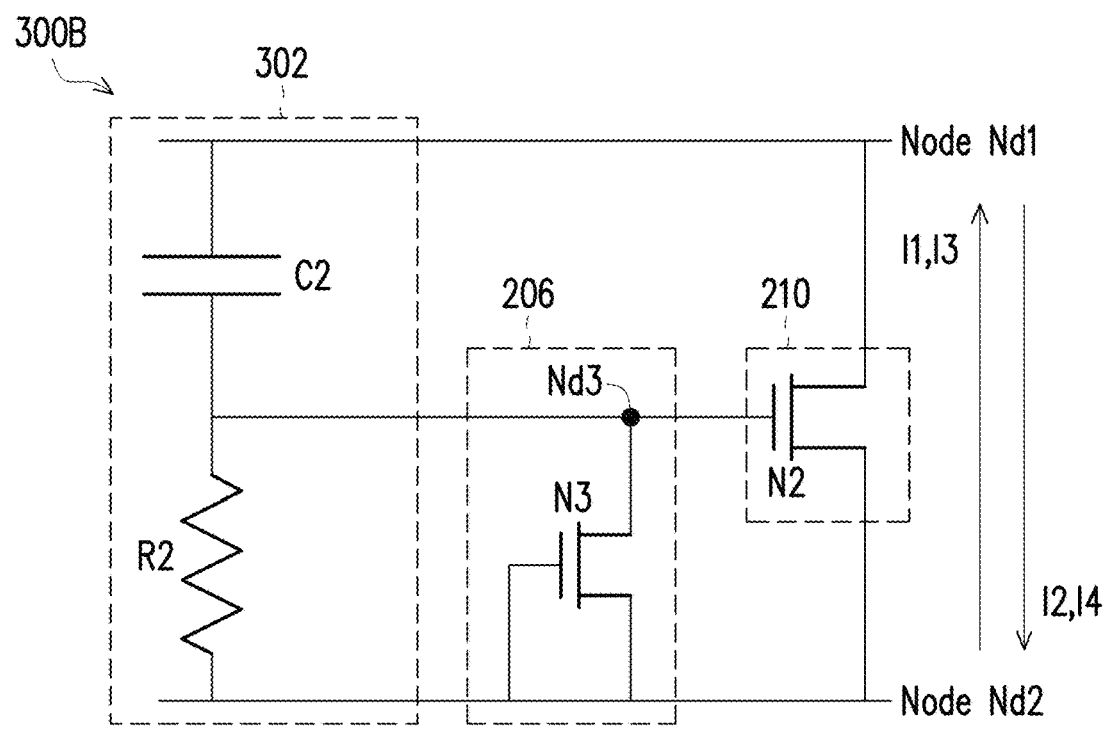
FIG. 3B is a circuit diagram of an integrated circuit, in accordance with some embodiments.

FIG. 3B is a circuit diagram of an integrated circuit 300B, in accordance with some embodiments.

Integrated circuit 300B is an embodiment of at least ESD clamp 120 or 130, and similar detailed description is therefore omitted.

Integrated circuit 300B is a variation of integrated circuit 200B of FIG. 2B or integrated circuit 300A of FIG. 3A, and similar detailed description is therefore omitted. In comparison with integrated circuit 200B, ESD detection circuit 302 of integrated circuit 300B replaces ESD detection circuit 202 of integrated circuit 200B, and similar detailed description is therefore omitted.

Integrated circuit 300B includes ESD detection circuit 302, charging circuit 206 and discharging circuit 210.

ESD detection circuit 302 is a variation of ESD detection circuit 202 of FIG. 2B, and similar detailed description is therefore omitted. ESD detection circuit 302 is described in integrated circuit 300A of FIG. 3A, and similar detailed description is therefore omitted.

ESD detection circuit 302 includes resistor R2 and capacitor C2. Resistor R2 and capacitor C2 are described in integrated circuit 300A of FIG. 3A, and similar detailed description is therefore omitted.

Each of the second end of capacitor C2, node Nd3, the first end of resistor R2, the gate of NMOS transistor N2 and the drain of NMOS transistor N3 are coupled together.

Each of the second end of resistor R2, node Nd2, the source of NMOS transistor N2, the gate of NMOS transistor N3 and the source of NMOS transistor N3 are coupled together.

The description for when an ESD event occurs at node Nd1 (e.g., ESD current I2 or I4 in the reverse ESD direction) with ESD detection circuit 302 for FIG. 3B is similar to the description of when an ESD event occurs at node Nd1 for ESD detection circuit 302 of FIG. 3A, and similar detailed description is therefore omitted for brevity.

Charging circuit 206 has a minimal effect on an ESD event at node Nd1. For example, in some embodiments, when an ESD event at node Nd1 occurs, NMOS transistor N3 is turned off.

The description for when an ESD event occurs at node Nd2 (e.g., ESD current I1 or I3 in the forward ESD direction) with charging circuit 206 for FIG. 3B is similar to the description of when an ESD event occurs at node Nd2 for charging circuit 206 of FIG. 2B, and similar detailed description is therefore omitted for brevity.

ESD detection circuit 302 has a minimal effect on an ESD event at node Nd2.

Other types of circuits, configurations and arrangements of at least ESD detection circuit 302, charging circuit 206 or discharging circuit 210 are within the scope of the present disclosure.

Other configurations or quantities of circuits in integrated circuit 300B are within the scope of the present disclosure.

Figure 4A:
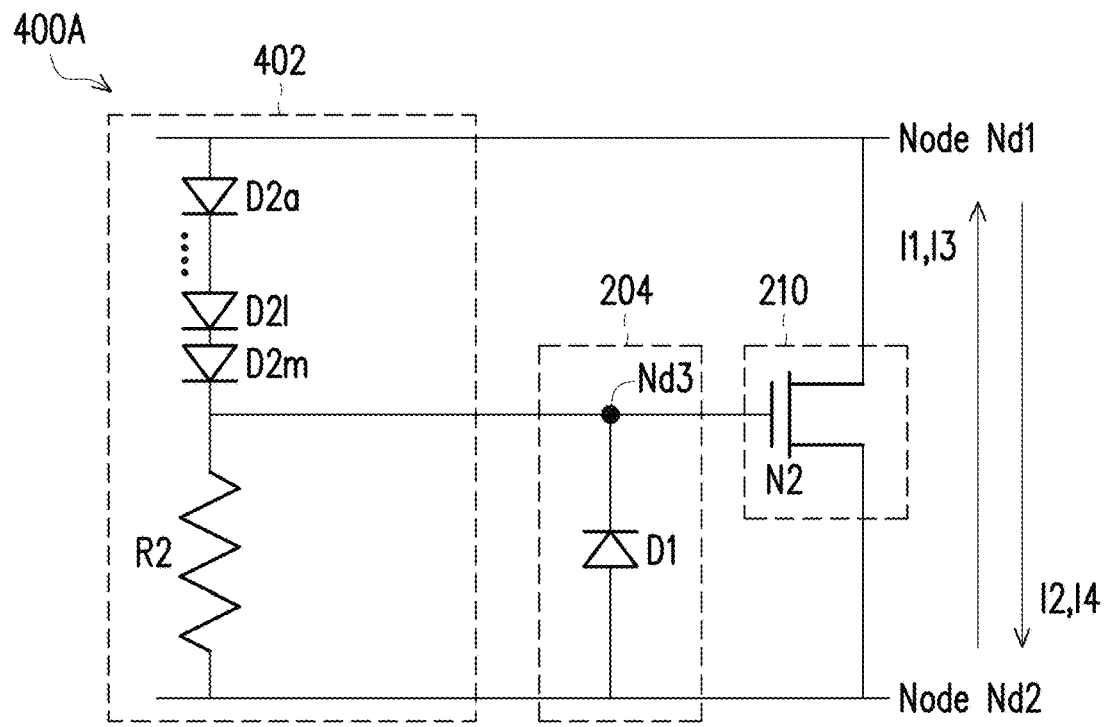
FIG. 4A is a circuit diagram of an integrated circuit, in accordance with some embodiments.

FIG. 4A is a circuit diagram of an integrated circuit 400A, in accordance with some embodiments.

Integrated circuit 400A is an embodiment of at least ESD clamp 120 or 130, and similar detailed description is therefore omitted.

Integrated circuit 400A is a variation of integrated circuit 200A of FIG. 2A or integrated circuit 300A of FIG. 3A, and similar detailed description is therefore omitted. In comparison with integrated circuit 200A, ESD detection circuit 402 of integrated circuit 400A replaces ESD detection circuit 202 of integrated circuit 200A. In comparison with integrated circuit 300A, ESD detection circuit 402 of integrated circuit 400A replaces ESD detection circuit 302 of integrated circuit 300A, and similar detailed description is therefore omitted.

Integrated circuit 400A includes ESD detection circuit 402, charging circuit 204 and discharging circuit 210.

ESD detection circuit 402 is a variation of ESD detection circuit 202 of FIG. 2A or ESD detection circuit 302 of FIG. 3A, and similar detailed description is therefore omitted. In comparison with ESD detection circuit 302, a set of diodes D2 of ESD detection circuit 402 replaces capacitor C2 of ESD detection circuit 302, and similar detailed description is therefore omitted.

ESD detection circuit 402 includes resistor R2 and the set of diodes D2.

The set of diodes D2 includes at least diode D2a, . . . , D2l or D2m coupled together in series, where m is an integer corresponding to the number of diodes in the set of diodes D2. In some embodiments, each diode of the set of diodes D2 has a same threshold voltage. In some embodiments, at least a diode of the set of diodes D2 has a different threshold voltage from another diode of the set of diodes D2.

Each of an anode of diode D2a, node Nd1, and the drain of NMOS transistor N2 are coupled together.

A cathode of diode D2a is coupled to an anode of diode D2b (not shown). An anode of diode D2l is coupled to a cathode of a previous diode (e.g., D2k (not shown)). A cathode of diode D2l is coupled to an anode of diode D2m.

Each of a cathode of diode D2m, node Nd3, the first end of resistor R2, the gate of NMOS transistor N2, and the cathode of diode D1 are coupled together.

When an ESD event at node Nd1 occurs (e.g., ESD current I2 or I4 in the reverse ESD direction), the ESD current or voltage at node Nd1 rises rapidly. In some embodiments, where each diode in the set of diodes D2 has a substantially equal threshold voltage, if the ESD voltage is greater than the integer m corresponding to the number of diodes in the set of diodes D2 multiplied by the threshold voltage, then the set of diodes D2 turn on or become forward biased. In response to where the set of diodes D2 turn on or become forward biased, the voltage of node Nd3 (e.g., across resistor R2) is caused to rise rapidly. In response to the rapidly rising voltage at node Nd3, the gate of NMOS transistor N2 of the discharging circuit 210 is charged by ESD detection circuit 302. In response to being charged by ESD detection circuit 302, NMOS transistor N2 of discharging circuit 210 is turned on and couples node Nd1 to node Nd2. By being turned on and coupling node Nd1 to node Nd2, the channel of NMOS transistor N2 discharges the ESD current I2 or I4 in the reverse ESD direction from node Nd1 to Nd2.

Other numbers of diodes or threshold voltages of the set of diodes D2 are within the scope of the present disclosure. For example, the ESD event occurring at node Nd1 was described for the set of diodes D2 having equal threshold voltages, but it is understood that similar operation is applicable to diodes of the set of diodes D2 with different threshold voltages, and similar detailed description is therefore omitted for brevity.

Charging circuit 204 has a minimal effect on an ESD event at node Nd1. For example, in some embodiments, when an ESD event at node Nd1 occurs, diode dl is reverse biased and is therefore turned off. ESD detection circuit 302 has a minimal effect on an ESD event at node Nd2.

The description for when an ESD event occurs at node Nd2 (e.g., ESD current I1 or I3 in the forward ESD direction) with charging circuit 204 for FIG. 4A is similar to the description of when an ESD event occurs at node Nd2 for charging circuit 204 of FIG. 2A, and similar detailed description is therefore omitted for brevity.

ESD detection circuit 402 has a minimal effect on an ESD event at node Nd2.

Other types of circuits, configurations and arrangements of at least ESD detection circuit 402, charging circuit 204 or discharging circuit 210 are within the scope of the present disclosure.

Other configurations or quantities of circuits in integrated circuit 400A are within the scope of the present disclosure.

Figure 4B:
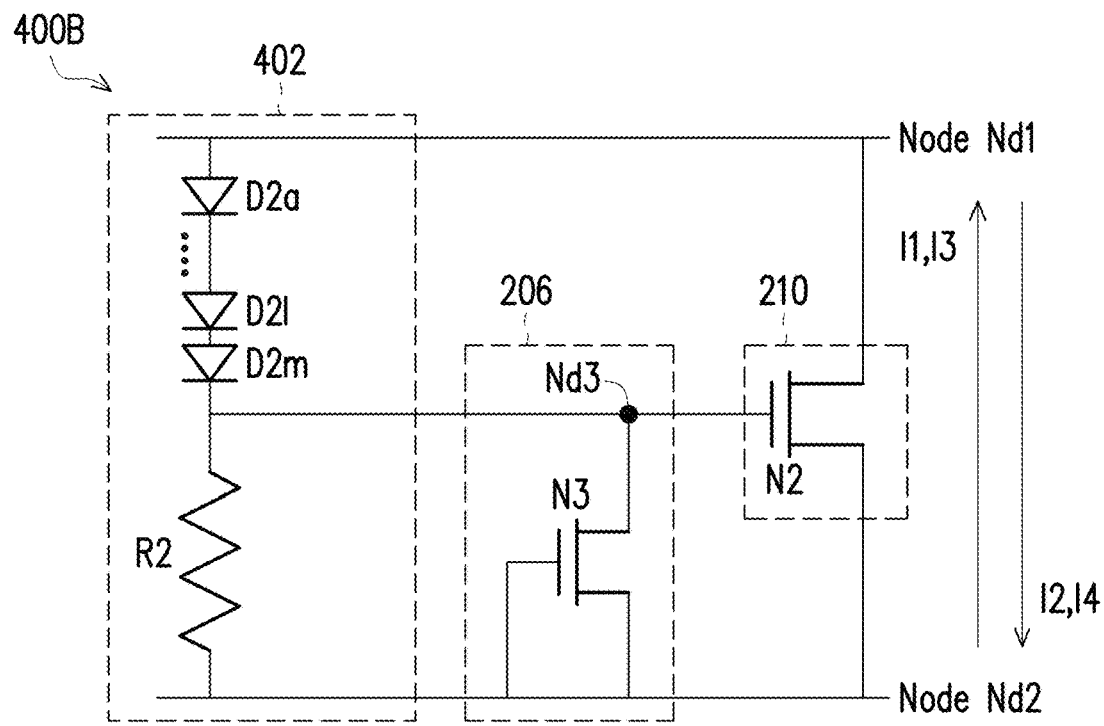
FIG. 4B is a circuit diagram of an integrated circuit, in accordance with some embodiments.

FIG. 4B is a circuit diagram of an integrated circuit 400B, in accordance with some embodiments.

Integrated circuit 400B is an embodiment of at least ESD clamp 120 or 130, and similar detailed description is therefore omitted.

Integrated circuit 400B is a variation of integrated circuit 200B of FIG. 2B, integrated circuit 300A of FIG. 3A or integrated circuit 400A of FIG. 4A, and similar detailed description is therefore omitted. In comparison with integrated circuit 200B, ESD detection circuit 402 of integrated circuit 400B replaces ESD detection circuit 202 of integrated circuit 200B. In comparison with integrated circuit 300B, ESD detection circuit 402 of integrated circuit 400B replaces ESD detection circuit 302 of integrated circuit 300B, and similar detailed description is therefore omitted.

Integrated circuit 400B includes ESD detection circuit 402, charging circuit 206 and discharging circuit 210.

ESD detection circuit 402 is a variation of ESD detection circuit 202 of FIG. 2A or ESD detection circuit 302 of FIG. 3A, and similar detailed description is therefore omitted. ESD detection circuit 402 is described in integrated circuit 400A of FIG. 4A, and similar detailed description is therefore omitted.

ESD detection circuit 402 includes resistor R2 and the set of diodes D2. The set of diodes D2 is described in integrated circuit 400A of FIG. 4A, and similar detailed description is therefore omitted.

Each of the cathode of diode D2m, node Nd3, the first end of resistor R2, the gate of NMOS transistor N2, and the drain of NMOS transistor N3 are coupled together.

The description for when an ESD event occurs at node Nd1 (e.g., ESD current I2 or I4 in the reverse ESD direction) with ESD detection circuit 402 for FIG. 4B is similar to the description of when an ESD event occurs at node Nd1 for ESD detection circuit 402 of FIG. 4A, and similar detailed description is therefore omitted for brevity.

Charging circuit 206 has a minimal effect on an ESD event at node Nd1. For example, in some embodiments, when an ESD event at node Nd1 occurs, NMOS transistor N3 is turned off.

The description for when an ESD event occurs at node Nd2 (e.g., ESD current I1 or I3 in the forward ESD direction) with charging circuit 206 for FIG. 4B is similar to the description of when an ESD event occurs at node Nd2 for charging circuit 206 of FIG. 3B, and similar detailed description is therefore omitted for brevity.

ESD detection circuit 402 has a minimal effect on an ESD event at node Nd2.

Other types of circuits, configurations and arrangements of at least ESD detection circuit 402, charging circuit 206 or discharging circuit 210 are within the scope of the present disclosure.

Other configurations or quantities of circuits in integrated circuit 400B are within the scope of the present disclosure.

Figure 4C:
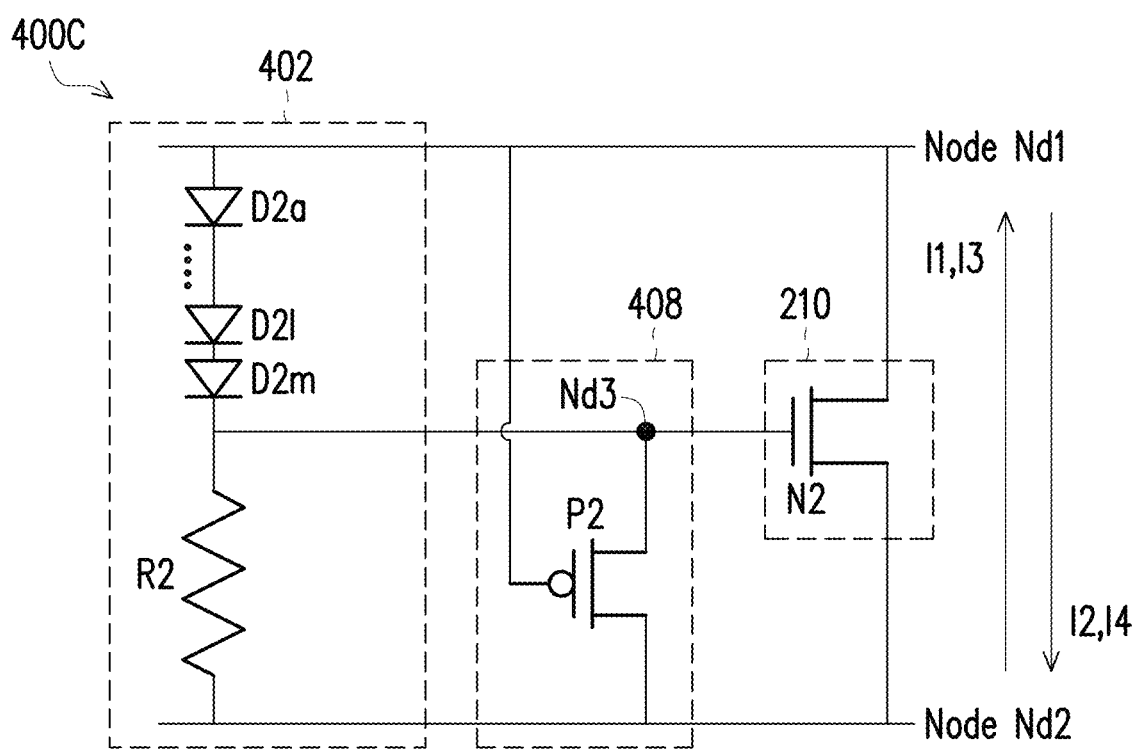
FIG. 4C is a circuit diagram of an integrated circuit, in accordance with some embodiments.

FIG. 4C is a circuit diagram of an integrated circuit 400C, in accordance with some embodiments.

Integrated circuit 400C is an embodiment of at least ESD clamp 120 or 130, and similar detailed description is therefore omitted.

Integrated circuit 400C is a variation of integrated circuit 200A of FIG. 2A, integrated circuit 300A of FIG. 3A, integrated circuit 400A of FIG. 4A, integrated circuit 400B of FIG. 4B, and similar detailed description is therefore omitted. In comparison with integrated circuit 400A, charging circuit 408 of integrated circuit 400C replaces charging circuit 204 of integrated circuit 400A. In comparison with integrated circuit 400B, charging circuit 408 of integrated circuit 400C replaces charging circuit 206 of integrated circuit 400B, and similar detailed description is therefore omitted.

Integrated circuit 400A includes ESD detection circuit 402, charging circuit 408 and discharging circuit 210.

Charging circuit 408 is a variation of charging circuit 204 of FIG. 2A, 3A or 4A, and similar detailed description is therefore omitted. Charging circuit 408 is a variation of charging circuit 206 of FIG. 2B, 3B or 4B, and similar detailed description is therefore omitted.

In comparison with charging circuit 204, a PMOS transistor P2 of charging circuit 408 replaces diode D1 of charging circuit 204, and similar detailed description is therefore omitted. In comparison with charging circuit 206, PMOS transistor P2 of charging circuit 408 replaces NMOS transistor N1 of charging circuit 206, and similar detailed description is therefore omitted.

Charging circuit 408 includes PMOS transistor P2. PMOS transistor P2 is a gate VDD PMOS transistor. PMOS transistor P2 includes a gate, a drain and a source (not labelled).

Each of the gate of PMOS transistor P2, the anode of diode D2a, node Nd1, and the drain of NMOS transistor N2 are coupled together.

Each of the source of PMOS transistor P2, the cathode of diode D2m, node Nd3, the first end of resistor R2 and the gate of NMOS transistor N2 are coupled together.

Each of the source of PMOS transistor P2, the second end of resistor R2, node Nd2 and the source of NMOS transistor N2 are coupled together.

The description for when an ESD event occurs at node Nd1 (e.g., ESD current I2 or I4 in the reverse ESD direction) with ESD detection circuit 402 for FIG. 4C is similar to the description of when an ESD event occurs at node Nd1 for ESD detection circuit 402 of FIG. 4A, and similar detailed description is therefore omitted for brevity.

Charging circuit 408 has a minimal effect on an ESD event at node Nd1. For example, in some embodiments, when an ESD event at node Nd1 occurs, PMOS transistor P2 is turned off.

When an ESD event at node Nd2 occurs (e.g., ESD current I1 or I3 flows in the forward ESD direction), the ESD current or voltage at node Nd2 rises rapidly, and charging circuit 408 detects the rapidly rising current or voltage at node Nd2 of the ESD event, causing PMOS transistor P2 of the charging circuit 408 to turn on. In response to turning on, PMOS transistor P2 couples node Nd2 to node Nd3 and thereby charges node Nd3 and the gate of NMOS transistor N2 of the discharging circuit 210 in response to the rising ESD voltage or current. In response to being charged by PMOS transistor P2 of charging circuit 408, NMOS transistor N2 of discharging circuit 210 is turned on and couples node Nd2 to node Nd1. By being turned on and coupling node Nd2 to node Nd1, the channel of NMOS transistor N2 discharges the ESD current I1 or I3 in the forward ESD direction from node Nd2 to Nd1.

ESD detection circuit 402 has a minimal effect on an ESD event at node Nd2.

By using PMOS transistor P2 of charging circuit 408 to trigger or turn on the NMOS transistor N1 during an ESD event at node Nd2, the channel of NMOS transistor N1 is used to discharge the ESD current I1 or I3 in the forward ESD direction from node Nd2 to Nd1. In comparison with other approaches that utilize a body diode to reduce the ESD event in the forward ESD direction, or to other approaches that have the bulk removed during manufacturing (e.g., bulk-less process), integrated circuit 400C or 500C (FIG. 5C) has better ESD discharging capability and performance than other approaches.

Other types of circuits, configurations and arrangements of at least ESD detection circuit 402, charging circuit 408 or discharging circuit 210 are within the scope of the present disclosure.

Other configurations or quantities of circuits in integrated circuit 400C are within the scope of the present disclosure.

Figure 5A:
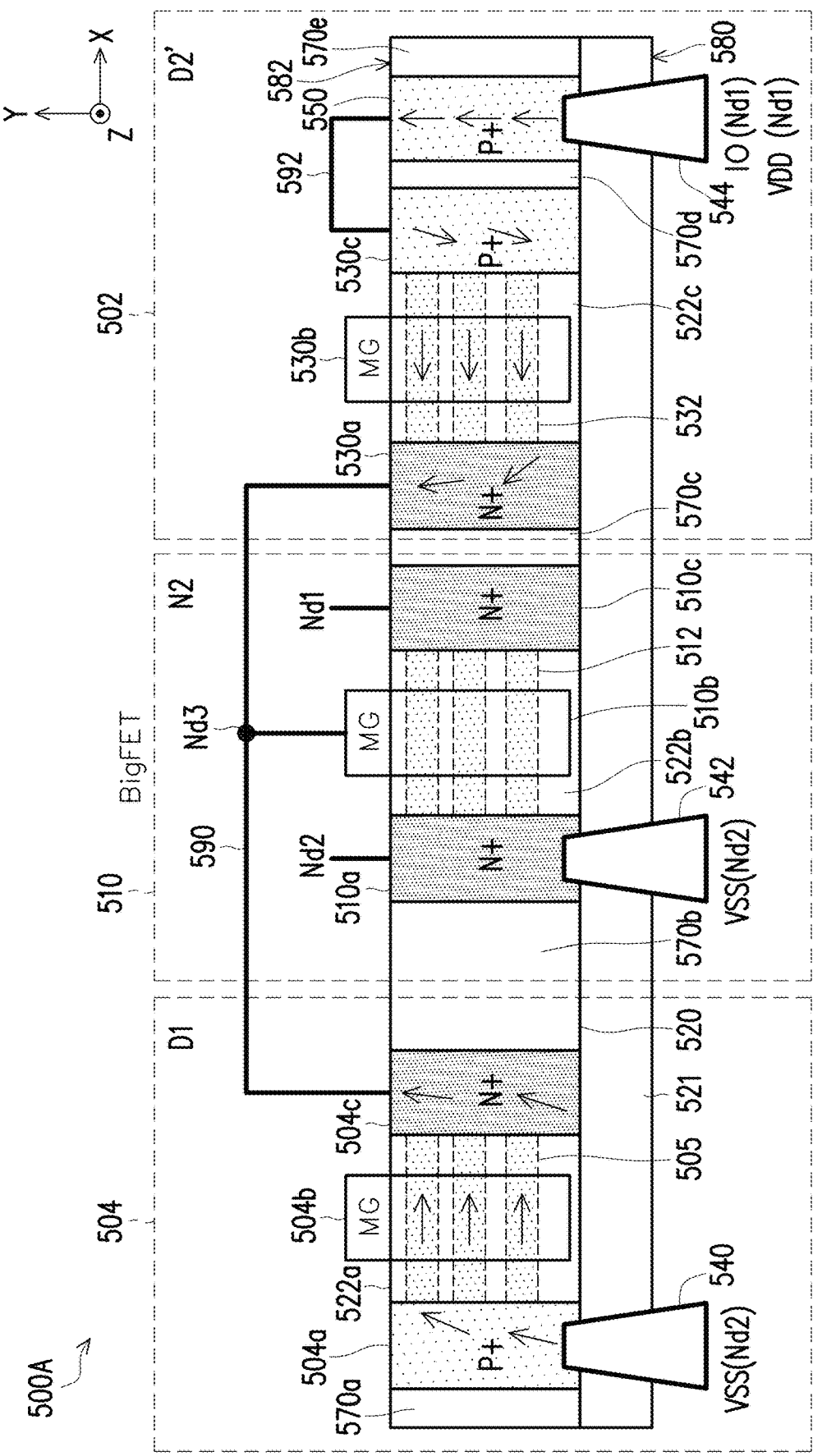
FIG. 5A is a cross-sectional view of an integrated circuit, in accordance with some embodiments.

FIG. 5A is a cross-sectional view of an integrated circuit 500A, in accordance with some embodiments.

Integrated circuit 500A is an embodiment of at least ESD clamp 120 or 130, and similar detailed description is therefore omitted. Integrated circuit 500A is an embodiment of integrated circuit 400A, and similar detailed description is therefore omitted.

Figure 5B:
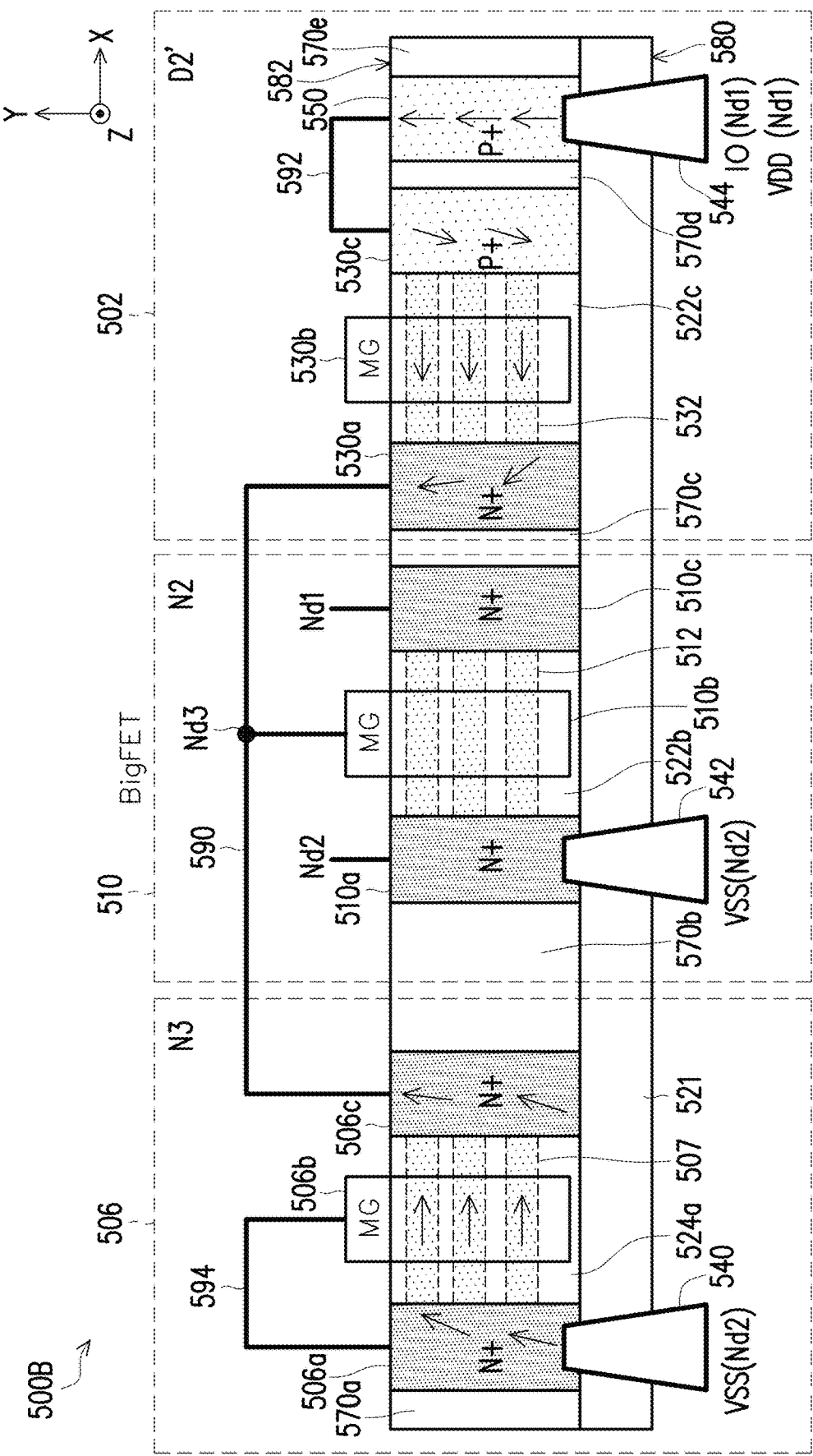
FIG. 5B is a cross-sectional view of an integrated circuit, in accordance with some embodiments.
Figure 5C:
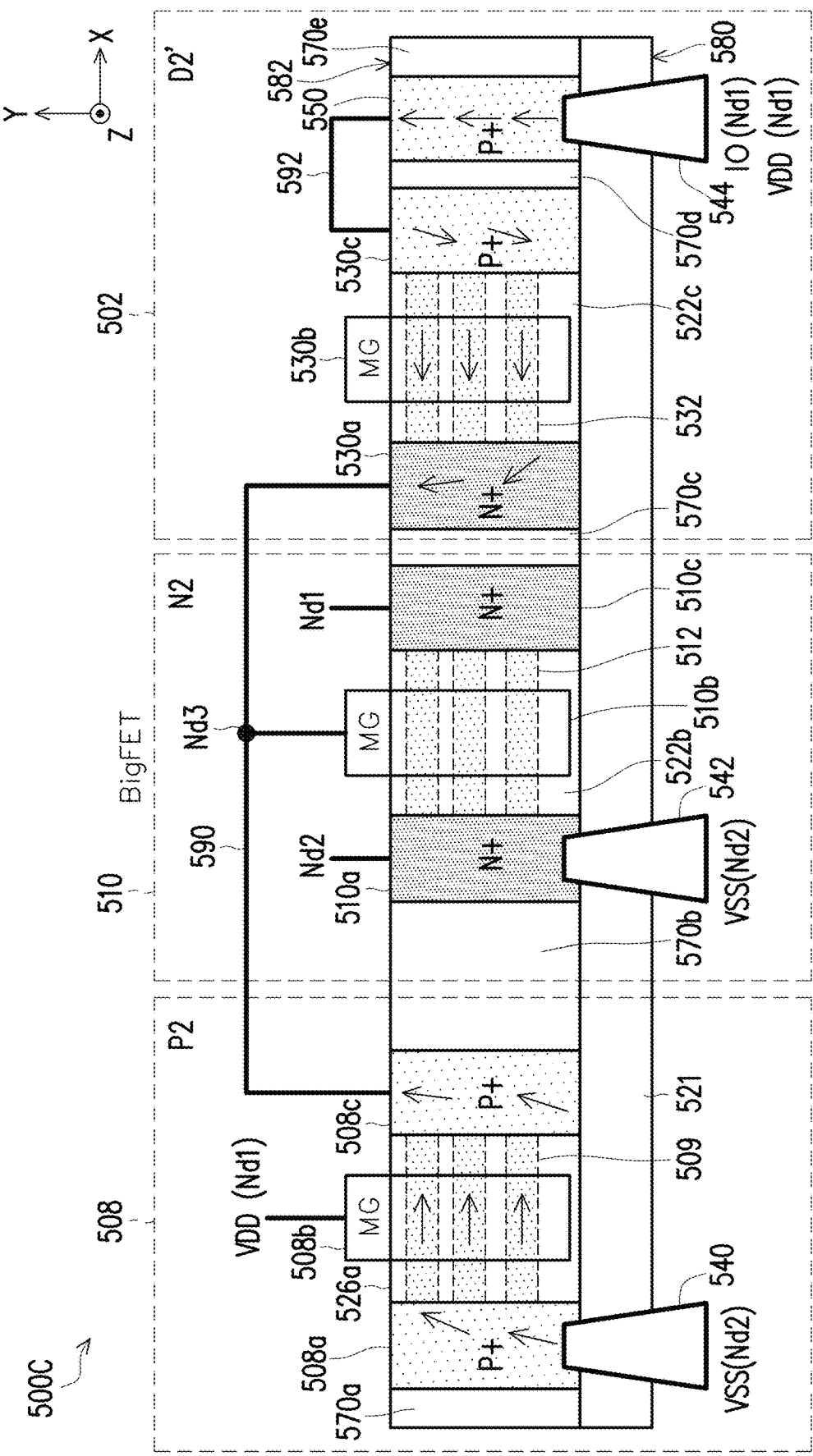
FIG. 5C is a cross-sectional view of an integrated circuit, in accordance with some embodiments.

While FIGS. 5A-5C are described with respect to a portion of the ESD detection circuit 502 of FIGS. 4A-4C, the teachings of FIGS. 5A-5C are also applicable to each of FIGS. 2A-2B & 3A-3B with ESD detection circuits 202 and 302, and similar detailed description is therefore omitted for brevity.

Integrated circuit 500A includes an ESD detection circuit 502, a charging circuit 504 and a discharging circuit 510.

ESD detection circuit 502 is an embodiment of ESD detection circuit 402 of FIG. 4A, charging circuit 504 is an embodiment of charging circuit 204 of FIGS. 2A, 3A & 4A, and discharging circuit 510 is an embodiment of discharging circuit 210 of FIGS. 2A-2B, 3A-3B & 4A-4C, and similar detailed description is therefore omitted.

Integrated circuit 500A further includes a substrate 520. Substrate 520 has a front side 582 and a backside 580 opposite from the front side 582 in a second direction Y. A bulk of substrate 520 has been removed during wafer thinning. In some embodiments, the bulk of substrate 520 has not been removed, and the operation of integrated circuits 500A-500C with a bulk of substrate 520 is similar to the descriptions where the bulk of substrate 520 has been removed, and similar description is omitted for brevity. In some embodiments, when the bulk of substrate 520 has not been removed, integrated circuits 500A-500C do not include at least conductive structure 540, conductive structure 542, conductive structure 544 or signal tap 550. In some embodiments, substrate 520 is part of a super power rail (SPR) technology or process. In some embodiments, substrate 520 is a silicon on insulator (SOI) technology or process. In some embodiments, since the bulk of substrate 520 has been removed during wafer thinning causes an intrinsic body diode formed by discharging circuit 510 and substrate 520 to be reduced compared with approaches having bulks. However, by using diode D1 of charging circuit 504, NMOS transistor N3 of charging circuit 506 or PMOS transistor P2 of charging circuit 508 to trigger or turn on the NMOS transistor 210 during an ESD event at node Nd2, the channel 512 of NMOS transistor N1 is used to discharge the ESD current I1 or I3 in the forward ESD direction from node Nd2 to Nd1. In comparison with other approaches that utilize a body diode to reduce the ESD event in the forward ESD direction, or to other approaches that have the bulk removed during manufacturing (e.g., bulk-less process), integrated circuits 500A-500C have better ESD discharging capability and performance than other approaches while occupying less area.

In some embodiments, substrate 520 is a p-type substrate. In some embodiments, substrate 520 is an n-type substrate. In some embodiments, substrate 520 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 520 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Integrated circuit 500A further includes an insulating layer 521 between the back-side 580 and front-side 582 of substrate 520. In some embodiments, the insulating layer 521 is a non-conducting oxide material. In some embodiments, the insulating layer 521 is formed on the back-side 580 of substrate 520 after wafer thinning and oxide regrowth. In some embodiments, insulating layer 521 includes SiO, $SiO_2$ or combinations thereof, or the like.

Integrated circuit 500A further includes at least a well 522a, a well 522b or a well 522c on substrate 520. Well 522a has p-type dopant impurities and is referred to as a P-type well. In some embodiments, well 522a has n-type dopant impurities and is referred to as an N-type well.

Well 522b is positioned between well 522a and well 522c. In some embodiments, well 522b is adjacent to at least well 522a or well 522c. In some embodiments, a first element is adjacent to a second element corresponds to the first element being directly next to the second element. In some embodiments, the first element is adjacent to the second element corresponds to the first element not being directly next to the second element.

Well 522b has p-type dopant impurities and is referred to as a P-type well. In some embodiments, well 522b has n-type dopant impurities and is referred to as an N-type well.

Well 522c has p-type dopant impurities and is referred to as a P-type well. In some embodiments, well 522c has n-type dopant impurities and is referred to as an N-type well.

In some embodiments, at least two of well 522a, 522b or 522c are continuous well structures extending in the first direction X. In some embodiments, at least two adjacent wells of well 522a, 522b or 522c are discontinuous well structures extending in the first direction X, and electrically isolated from each other by at least a shallow trench isolation (STI) regions 570b and 570c. In some embodiments, well 522b is isolated by well 522a or 522c by at least corresponding STI region 570b or 570c.

In some embodiments, integrated circuit 500A further includes one or more STI regions 570a, 570b, 570c, 570d or 570e. STI region 570a is adjacent to anode region 504a of charging circuit 504. STI region 570b is between charging circuit 504 and discharging circuit 510. STI region 570c is between ESD protection circuit 502 and discharging circuit 510. STI region 570d is between anode 530c and signal tap 550. STI region 570e is adjacent to signal tap 550. STI regions 570b and 570c are configured to isolate ESD detection circuit 502, charging circuit 504 and discharging circuit 510 from each other. STI regions 570a and 570e are configured to isolate ESD detection circuit 502, charging circuit 504 and discharging circuit 510 from other portions of integrated circuit 500A-500C (not shown). In some embodiments, at least STI region 570a, 570b, 570c, 570d or 570e is not included in at least integrated circuit 500A, 500B or 500C. In some embodiments, in at least integrated circuit 500A, 500B or 500C, at least STI region 570b or 570c is replaced with a signal tap region between two STI regions, and the corresponding signal tap regions are similar to signal tap 550. In some embodiments, in at least integrated circuit 500A, 500B or 500C, at least STI region 570b or 570c is replaced with a corresponding dummy cell. In some embodiments, the dummy cell is a dummy device. In some embodiments, a dummy device is a non-functional transistor or non-functional diode device.

ESD detection circuit 502 includes a cathode 530a, a gate structure 530b, an anode 530c, a channel region 532 and a signal tap 550. ESD detection circuit 502 includes a diode D2' that corresponds to a diode of the set of diodes D2 of FIGS. 4A-4C.

In some embodiments, signal tap 550 corresponds to a well tap. In some embodiments, a well tap is electrically conductive materials that couple source/drain regions of the detection circuit 530c to voltage supply node 104 (e.g., supply voltage VDD). For example, in some embodiments, the signal tap 550 is a heavily doped p-region in a p-type well on a p-type substrate. In some embodiments, the heavily doped n-region is coupled through the well tap to voltage supply node 104 (e.g., supply voltage VDD) thereby setting the potential of the n-type well to prevent leakage from adjacent source/drain regions into the p-well/p-substrate.

In some embodiments, signal tap 550 corresponds to a substrate tap. In some embodiments, a substrate tap is an electrically conductive materials that couples region 508a or 510a to reference voltage supply node 106 (e.g., supply voltage VSS). For example, in some embodiments, signal tap 550 of substrate 202 includes a heavily doped p-region which is formed in a p-type substrate. In some embodiments, the heavily doped p-region is coupled through the substrate tap 550 to the reference voltage supply node 106 (e.g., reference supply voltage VSS) thereby setting the potential of the substrate 520 to prevent leakage from adjacent source/drain regions.

For ease of illustration, conductive structures of ESD detection circuit 502 located in upper metallization layers which correspond to resistor R1 or R2 in FIGS. 2A-2B, 3A-3B, and 4A-4C are not shown. For ease of illustration, capacitors of ESD detection circuit 502 which correspond to capacitor C1 or C2 in FIGS. 2A-2B, 3A-3B, and 4A-4C are not shown.

The gate structure 530b is partially over well 522c, and in between anode 530c and cathode 530a. The anode 530c is a P-type active region having P-type dopants implanted in well 522c. The cathode 530a is an N-type active region having N-type dopants implanted in well 522c. In some embodiments, at least anode 530c or cathode 530a extends above substrate 520. The channel region 532 is in well 522c and connects the anode 530c and the cathode 530a.

The anode 530c and the cathode 530a together form a PN junction. In some embodiments, the anode 530c corresponds to the anode of a diode D2', the cathode 530a corresponds to the cathode of diode D2' and the channel region 532 corresponds to a channel region of diode D2'. Diode D2' corresponds to a diode of the set of diodes D2 of FIGS. 4A-4C.

In some embodiments, the gate structure 530b is electrically floating.

The signal tap 550 is between STI region 570d and STI region 570e. In some embodiments, the signal tap 550 is positioned in other regions of at least integrated circuit 500A, 500B or 500C. For example, in some embodiments, in at least integrated circuit 500A, 500B or 500C, at least STI region 570a, 570b or 570c is replaced with two STI regions and a signal tap region (similar to signal tap 550) between the two STI regions, and the corresponding signal tap regions are similar to signal tap 550. Signal tap 550 is coupled to a conductive structure 544. Each of signal tap 550 and conductive structure 544 are coupled to node Nd1 which corresponds to the voltage supply terminal (e.g., voltage VDD) or the IO pad terminal 108. In some embodiments, signal tap 550 is a p+ type doped region. In some embodiments, signal tap 550 is an n+ type doped region.

Signal tap 550 is further coupled to the anode 530c of Diode D2' of discharging circuit 502 by a conductive line 592.

Other types of circuits, configurations and arrangements of ESD detection circuit 502 are within the scope of the present disclosure.

Charging circuit 504 includes an anode region 504a, a gate structure 504b, a cathode region 504c, and a channel region 505. Charging circuit 504 is diode D1 of FIGS. 2A, 3A and 4A.

The gate structure 504b is partially over well 522a, and in between anode 504a and cathode 504c. The anode 504a is a P-type active region having P-type dopants implanted in well 522a. The cathode 504c is an N-type active region having N-type dopants implanted in well 522a. In some embodiments, at least anode 504a or cathode 504c extends above substrate 520. The channel region 505 is in well 522a and connects the anode 504a and the cathode 504c.

The anode 504a and the cathode 504c together form a PN junction. In some embodiments, the anode 504a corresponds to the anode of diode D1, the cathode 504c corresponds to the cathode of diode D1 and the channel region 505 corresponds to a channel region of diode D1 of FIGS. 2A, 3A and 4A.

In some embodiments, the gate structure 504b is electrically floating, and is configured to charge the gate 510b of discharging circuit 510 in the forward ESD direction or the reverse ESD direction.

Other types of circuits, configurations and arrangements of charging circuit 504 are within the scope of the present disclosure.

Discharging circuit 510 includes a source region 510a, a gate structure 510b, a drain region 510c, and a channel region 512. Discharging circuit 510 is NMOS transistor N1 of FIGS. 2A-2B, 3A-3B and 4A-4C.

The gate structure 510b is over well 522b. The source region 510a is an N-type active region having N-type dopants implanted in the well 522b. The drain region 510c is an N-type active region having N-type dopants implanted in well 522b. In some embodiments, at least source region 510a or drain region 510c extends above substrate 520. The channel region 512 is in well 522b and connects the source region 510a and the drain region 510c.

Each of the gate structure 510b, the cathode 530a of diode D2', and the cathode 504c of diode D1 are coupled together by a conductive line 590 that corresponds to node ND3 of FIGS. 2A-2B, 3A-3B and 4A-4C.

In some embodiments, the drain region 510c is coupled to node ND1 or conductive structure 544. For ease of illustration, the drain region 510c and conductive structure 544 are not shown as being coupled to each other.

In some embodiments, the source region 510a is coupled to conductive structure 540 and conductive structure 542. For ease of illustration, the source region 510a, conductive structure 540, and conductive structure 542 are not shown as being coupled to each other.

In some embodiments, the gate structure 510b corresponds to the gate of NMOS transistor N1, the source region 510a corresponds to the source of NMOS transistor N1, the drain region 510c corresponds to the drain of NMOS transistor N1 and the channel region 512 corresponds to a channel region of NMOS transistor N1 of FIGS. 2A-2B, 3A-3B and 4A-4C.

In some embodiments, the drain region 510c and source region 510a of discharging circuit 510 of FIGS. 2A-2B is referred to as an oxide definition (OD) region which defines the source or drain diffusion regions of NMOS transistor N1 of FIGS. 2A-2B, 3A-3B and 4A-4C.

In some embodiments, drain region 510c is an extended drain region and has a greater size than source region 510a. In at least one embodiment, a silicide layer (not shown) covers a portion, but not the entirety, of drain region 510c. Such a partially silicided configuration of drain region 510c improves self-protection of NMOS transistor N1 of discharging circuit 510 from ESD events. In at least one embodiment, drain region 510c is fully silicided.

Gate structure 510b is arranged between drain region 510c and source region 510a. In some embodiments, at least gate structure 510b, 506b or 508b is a metal gate, and includes a conductive material such as a metal. In some embodiments, at least gate structure 510b, 506b or 508b includes polysilicon (also referred to herein as "POLY").

In some embodiments, at least channel region 505, 507, 509, 512 or 532 includes fins in accordance with fin field-effect transistor (FinFET) complementary metal-oxide-semiconductor (CMOS) technologies. In some embodiments, at least channel region 505, 507, 509, 512 or 532 includes nanosheets of nanosheet transistors. In some embodiments, at least channel region 505, 507, 509, 512 or 532 includes nanowire of nanowire transistors. In some embodiments, at least channel region 505, 507, 509, 512 or 532 is free of fins in accordance with planar CMOS technologies. Other types of transistors are within the scope of the present disclosure.

Other types of circuits, configurations and arrangements of discharging circuit 510 are within the scope of the present disclosure.

Integrated circuit 500A further includes a conductive structure 540, a conductive structure 542 and a conductive structure 544. Conductive structure 540, conductive structure 542 and conductive structure 544 are formed on the backside 580 of integrated circuits 500A-500C (described below). In some embodiments, at least conductive structure 540, conductive structure 542 or conductive structure 544 is embedded in substrate 520. In some embodiments, at least conductive structure 540, conductive structure 542 or conductive structure 544 is configured to provide an electrical connection between one or more circuit elements of integrated circuit 500A-500C and other one or more circuit elements of integrated circuit 500A-500C or other package structures (not shown).

In some embodiments, each of conductive structure 540, conductive structure 542 and conductive structure 544 is a corresponding via. In some embodiments, one or more of conductive structure 540, conductive structure 542, conductive structure 544 and signal tap 550 are used to electrically couple signals from the front-side 582 to the back-side 580 of substrate 520 since the front-side 582 and the 580 back-side are electrically isolated from each other by at least the insulating layer 521. In some embodiments, at least conductive structure 540 is directly coupled with corresponding source/drain region 530c, 510a or 504a. In some embodiments, at least conductive structure 540, 542 or 544 is directly coupled with one or more of source/drain region 530c, 510a or 504a.

In some embodiments, integrated circuit 500A is electrically connected to one or more other package structures (not shown) on the backside 580 of substrate 520 by at least conductive structure 540, conductive structure 542 or conductive structure 544.

In some embodiments, at least conductive structure 540, conductive structure 542 or conductive structure 544 corresponds to a copper pillar structure that includes at least a conductive material such as copper, or the like.

In some embodiments, at least conductive structure 540, conductive structure 542 or conductive structure 544 corresponds to a solder bump structure that includes a conductive material having a low resistivity, such as solder or a solder alloy. In some embodiments, a solder alloy includes Sn, Pb, Ag, Cu, Ni, Bi, or combinations thereof. Other configurations, arrangements and materials of at least conductive structure 540, conductive structure 542 or conductive structure 544 are within the contemplated scope of the present disclosure.

Conductive structure 540 is coupled to the anode region 504a of diode D1 of charging circuit 504. In some embodiments, conductive structure 540 corresponds to node ND2 of FIGS. 2A-2B, 3A-3B and 4A-4C. In some embodiments, conductive structure 540 is electrically coupled to node ND2 of FIGS. 2A-2B, 3A-3B and 4A-4C.

In some embodiments, conductive structure 542 corresponds to node ND2 of FIGS. 2A-2B, 3A-3B and 4A-4C. In some embodiments, conductive structure 542 is electrically coupled to node ND2 of FIGS. 2A-2B, 3A-3B and 4A-4C.

In some embodiments, conductive structure 540 and conductive structure 542 are coupled to each other. For ease of illustration, conductive structure 540 and conductive structure 542 are not shown as being coupled to each other.

In some embodiments, conductive structure 544 corresponds to node ND1 of FIGS. 2A-2B, 3A-3B and 4A-4C. In some embodiments, conductive structure 544 is electrically coupled to node ND1 of FIGS. 2A-2B, 3A-3B and 4A-4C.

In some embodiments, at least conductive structure 540, 542, 544, 590, 592 or 594 (FIG. 5B) includes one or more layers of a conductive material. In some embodiments, the conductive material includes Tungsten, Cobalt, Ruthenium, Copper, or the like or combinations thereof.

Other configurations, arrangements and materials of 540, 542, 544, 590, 592 or 594 (FIG. 5B) are within the contemplated scope of the present disclosure.

Other configurations or quantities of circuits in integrated circuit 500A are within the scope of the present disclosure.

FIG. 5B is a cross-sectional view of an integrated circuit 500B, in accordance with some embodiments.

Integrated circuit 500B is an embodiment of at least ESD clamp 120 or 130, and similar detailed description is therefore omitted. Integrated circuit 500B is an embodiment of integrated circuit 400B, and similar detailed description is therefore omitted.

Integrated circuit 500B is a variation of integrated circuit 500A of FIG. 5A, and similar detailed description is therefore omitted. In comparison with integrated circuit 500A, charging circuit 506 of integrated circuit 500B replaces charging circuit 504 of integrated circuit 500A, and well 524a of integrated circuit 500B replaces well 522a of integrated circuit 500A, and similar detailed description is therefore omitted.

Well 524a is a variation of well 522a of FIG. 5A, and similar detailed is therefore omitted. In comparison with well 522a of FIG. 5A, well 524a has n-type dopant impurities and is referred to as an N-type well. In some embodiments, well 524a has p-type dopant impurities and is referred to as a P-type well.

Charging circuit 506 is an embodiment of charging circuit 206 of FIGS. 2B, 3B & 4B, and similar detailed description is therefore omitted. Charging circuit 506 includes a source region 506a, a gate structure 506b, a drain region 506c, and a channel region 507. Charging circuit 506 is NMOS transistor N3 of FIGS. 2B, 3B and 4B. Charging circuit 506 is between STI region 570a and STI region 570b.

The gate structure 506b is partially over well 524a, and in between source region 506a and drain region 506c. The source region 506a is an N-type active region having N-type dopants implanted in well 524a. The drain region 506c is an N-type active region having N-type dopants implanted in well 524a. In some embodiments, at least source region 506a or drain region 506c extends above substrate 520. The channel region 507 is in well 524a and connects the source region 506a and the drain region 506c.

In some embodiments, the gate structure 506b corresponds to the gate of NMOS transistor N3, the source region 506a corresponds to the source of NMOS transistor N3, the drain region 506c corresponds to the drain of NMOS transistor N3 and the channel region 507 corresponds to a channel region of NMOS transistor N3 of FIGS. 2B, 3B and 4B.

Gate structure 506b is electrically coupled to source region 506a by a conductive line 594.

Each of the drain region 506c, the gate structure 510b and the cathode 530a of diode D2' are coupled together by conductive line 590 that corresponds to node ND3 of FIGS. 2A-2B, 3A-3B and 4A-4C.

Conductive structure 540 is coupled to the source region 506a of NMOS transistor N3 of charging circuit 506. In some embodiments, at least conductive structure 540 is directly coupled with corresponding source/drain region 530c, 510a or 506a. In some embodiments, at least conductive structure 540, 542 or 544 is directly coupled with one or more of source/drain region 530c, 510a or 506a.

Other types of circuits, configurations and arrangements of charging circuit 506 are within the scope of the present disclosure.

Other configurations or quantities of circuits in integrated circuit 500B are within the scope of the present disclosure.

FIG. 5C is a cross-sectional view of an integrated circuit 500C, in accordance with some embodiments.

Integrated circuit 500C is an embodiment of at least ESD clamp 120 or 130, and similar detailed description is therefore omitted. Integrated circuit 500C is an embodiment of integrated circuit 400C, and similar detailed description is therefore omitted.

Integrated circuit 500C is a variation of integrated circuit 500A of FIG. 5A, and similar detailed description is therefore omitted. In comparison with integrated circuit 500A, charging circuit 508 of integrated circuit 500C replaces charging circuit 504 of integrated circuit 500A, and well 526a of integrated circuit 500C replaces well 522a of integrated circuit 500A, and similar detailed description is therefore omitted.

Well 526a is a variation of well 524a of FIG. 5B, and similar detailed is therefore omitted. In comparison with well 524a of FIG. 5B, well 526a has p-type dopant impurities and is referred to as a P-type well. In some embodiments, well 526a has n-type dopant impurities and is referred to as an N-type well.

Charging circuit 508 is an embodiment of charging circuit 408 of FIG. 4C, and similar detailed description is therefore omitted. Charging circuit 508 includes a drain region 508a, a gate structure 508b, a source region 508c, and a channel region 509. Charging circuit 508 is PMOS transistor P2 of FIG. 4C. Charging circuit 508 is between STI region 570a and STI region 570b.

The gate structure 508b is partially over well 526a, and in between source region 508c and drain region 508a. The source region 508c is a P-type active region having P-type dopants implanted in well 526a. The drain region 508a is a P-type active region having P-type dopants implanted in well 526a. In some embodiments, at least source region 508c or drain region 508a extends above substrate 520. The channel region 509 is in well 526a and connects the source region 508c and the drain region 508a.

In some embodiments, the gate structure 508b corresponds to the gate of PMOS transistor P2, the source region 508c corresponds to the source of PMOS transistor P2, the drain region 508a corresponds to the drain of PMOS transistor P2 and the channel region 509 corresponds to a channel region of PMOS transistor P2 of FIG. 4C.

Gate structure 508b is coupled to node Nd1. In some embodiments, each of the gate structure 508b, the conductive structure 544 and the drain region 510c are coupled to each other. For ease of illustration, the gate structure 508b, conductive structure 544 and the drain region 510c are not shown as being coupled to each other.

Each of the source region 508c, the gate structure 510b and the cathode 530a of diode D2' are coupled together by conductive line 590 that corresponds to node ND3 of FIGS. 2A-2B, 3A-3B and 4A-4C.

Conductive structure 540 is coupled to the drain region 508a of PMOS transistor P2 of charging circuit 508. In some embodiments, at least conductive structure 540 is directly coupled with corresponding source/drain region 530c, 510a or 508a. In some embodiments, at least conductive structure 540, 542 or 544 is directly coupled with one or more of source/drain region 530c, 510a or 508a.

Other types of circuits, configurations and arrangements of charging circuit 508 are within the scope of the present disclosure.

Other configurations or quantities of circuits in integrated circuit 500C are within the scope of the present disclosure.

Figure 6:
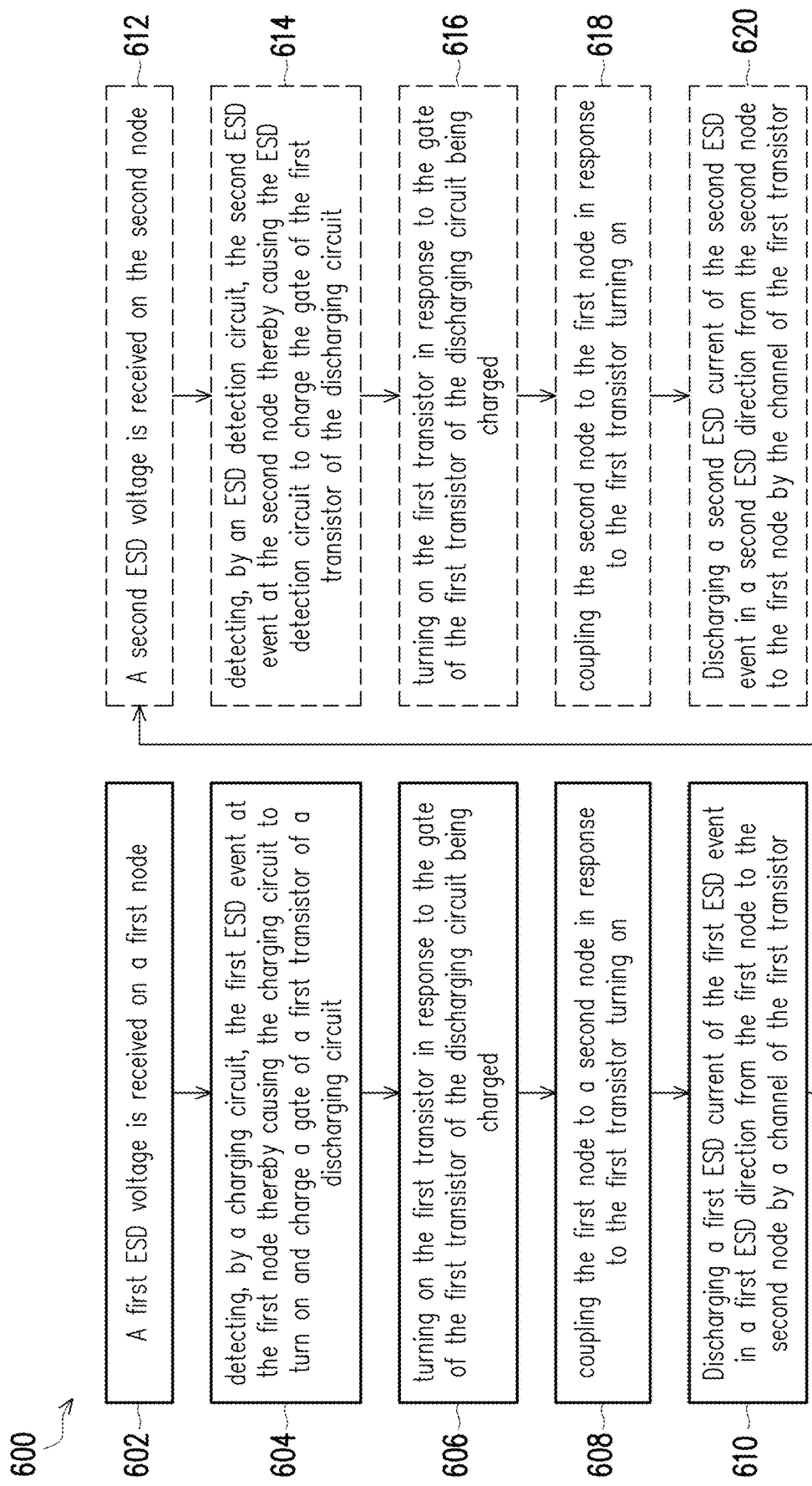
FIG. 6 is a flowchart of a method of operating an ESD circuit, in accordance with some embodiments.

FIG. 6 is a flowchart of a method 600 of operating an ESD circuit, in accordance with some embodiments. In some embodiments, the circuit of method 600 includes at least integrated circuit 100A-100B, 200A-200B, 300A-300B, 400A-400C and 500A-500C (FIGS. 1A-1B, 2A-2B, 3A-3B, 4A-4C and 5A-5C). It is understood that additional operations may be performed before, during, and/or after the method 600 depicted in FIG. 6, and that some other processes may only be briefly described herein. It is understood that method 600 utilizes features of one or more of integrated circuit 100A-100B, 200A-200B, 300A-300B, 400A-400C or 500A-500C.

At operation 602 of method 600, a first ESD voltage is received on a first node. In some embodiments, the first node of method 600 includes node Nd2. In some embodiments, the first ESD voltage is greater than a reference supply voltage VSS of reference voltage supply node 106. In some embodiments, the first ESD voltage corresponds to a first ESD event.

At operation 604, a charging circuit detects the first ESD event at the first node thereby causing the charging circuit to turn on and charge a gate of a first transistor of a discharging circuit.

In some embodiments, the charging circuit of method 600 includes at least charging circuit 204, 206, 408, 504, 506 or 508. In some embodiments, the discharging circuit of method 600 includes at least discharging circuit 210 or 510. In some embodiments, the first transistor of method 600 includes at least NMOS transistor N2.

In some embodiments, the discharging circuit is coupled between the first node and a second node. In some embodiments, the charging circuit is coupled between at least the first node and a third node. In some embodiments, the second node of method 600 includes node Nd1. In some embodiments, the third node of method 600 includes node Nd3 or Nd4.

At operation 606, the first transistor is turned on in response to the gate of the first transistor of the discharging circuit being charged.

At operation 608, the first node is coupled to the second node in response to the first transistor turning on.

At operation 610, a first ESD current of the first ESD event at the first node is discharged in a first ESD direction from the first node to the second node by a channel of the first transistor N2.

In some embodiments, the first ESD current corresponds to the forward ESD direction. In some embodiments, the first ESD current includes the ESD current I1 or I3 in the forward ESD direction from node Nd2 to node Nd1. In some embodiments, the channel of the first transistor includes the channel region 512.

At operation 612 of method 600, a second ESD voltage is received on the second node. In some embodiments, the second ESD voltage is greater than a supply voltage VDD of voltage supply node 104 or a voltage of IO pad 108. In some embodiments, the second ESD voltage corresponds to a second ESD event.

At operation 614, an ESD detection circuit detects the second ESD event at the second node thereby causing the ESD detection circuit to charge the gate of the first transistor of the discharging circuit. In some embodiments, the ESD detection circuit of method 600 includes at least ESD detection circuit 202, 302, 402 or 502. In some embodiments, the ESD detection circuit is coupled to at least the first node, the second node or the third node. In some embodiments, the ESD detection circuit is further coupled to a fourth node. In some embodiments, the fourth node includes node Nd4.

At operation 616, the first transistor is turned on in response to the gate of the first transistor of the discharging circuit being charged.

At operation 618, the first node is coupled to the second node in response to the first transistor turning on.

At operation 620, a second ESD current of the second ESD event is discharged in a second ESD direction from the second node to the first node by the channel of the first transistor.

In some embodiments, the second ESD current corresponds to the reverse ESD direction. In some embodiments, the second ESD current includes the ESD current I2 or I4 in the reverse ESD direction from node Nd1 to node Nd2. In some embodiments, the second ESD current is in an opposite direction from the first ESD current.

In some embodiments, one or more of the operations of method 600 is not performed.

Figure 7:
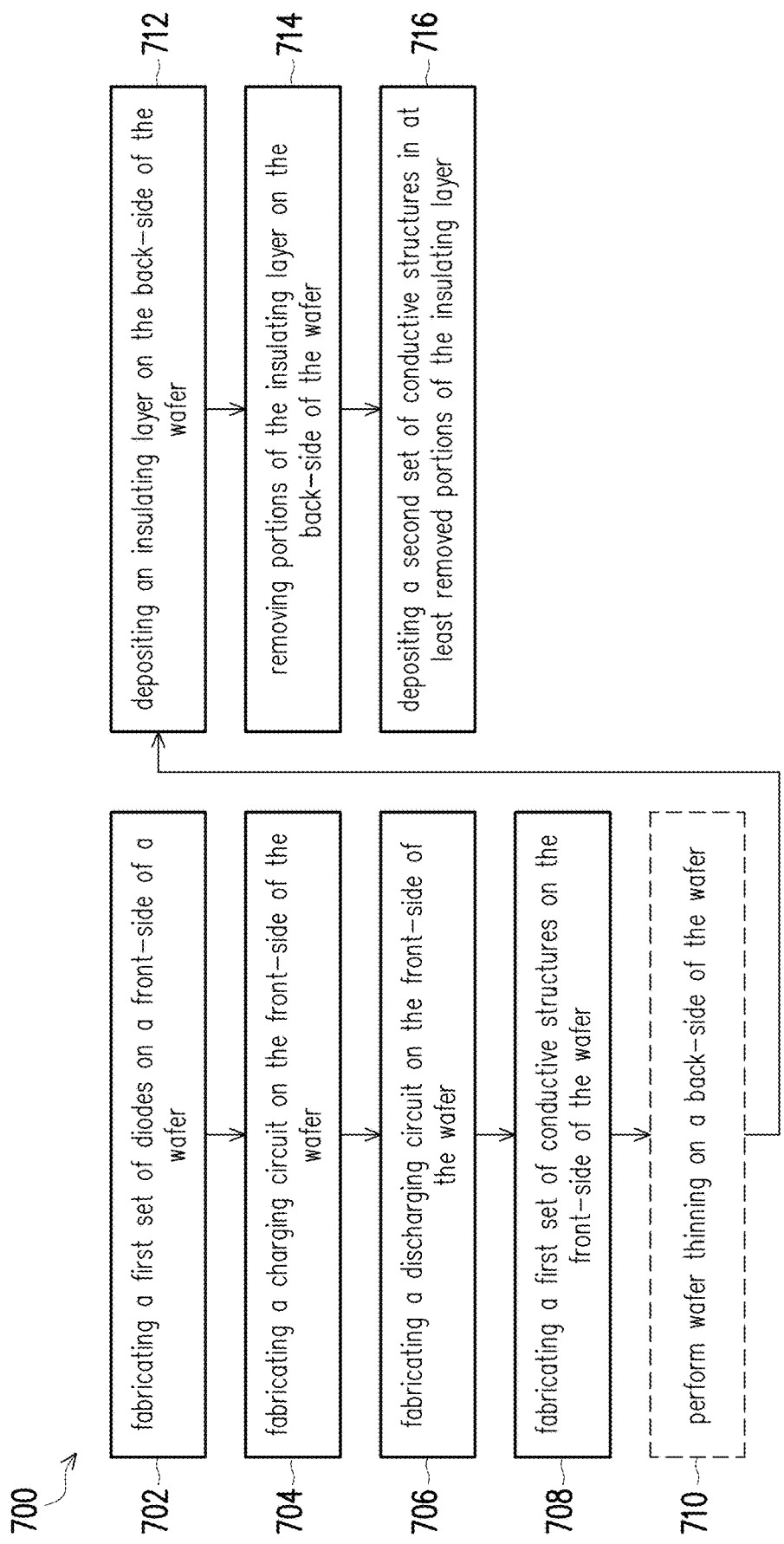
FIG. 7 is a flow chart of a method of manufacturing an integrated circuit, in accordance with some embodiments.

FIG. 7 is a flow chart of a method 700 of manufacturing an integrated circuit, in accordance with some embodiments. In some embodiments, the method 700 is usable to manufacture or fabricate at least integrated circuit 100A-100B, 200A-200B, 300A-300B, 400A-400C or 500A-500C (FIG. 1A-1B, 2A-2B, 3A-3B, 4A-4C or 5A-5C). It is understood that additional operations may be performed before, during, and/or after the method 700 depicted in FIG. 7, and that some other processes may only be briefly described herein. It is understood that method 700 utilizes features of one or more of integrated circuit 100A-100B, 200A-200B, 300A-300B, 400A-400C or 500A-500C (FIG. 1A-1B, 2A-2B, 3A-3B, 4A-4C or 5A-5C).

Method 700 is applicable to at least integrated circuit 500A, 500B or 500C. Method 700 is described with respect to integrated circuit 500A, 500B or 500C. However, method 700 is also applicable to integrated circuit 100A-100B, 200A-200B, 300A-300B or 400A-400C. Other order of operations of method 700 with respect to integrated circuit 500A, 500B or 500C is within the scope of the present disclosure.

In operation 702 of method 700, a first set of diodes is fabricated on a front-side of a wafer. In some embodiments, the wafer of method 700 includes substrate 520. In some embodiments, the front-side of the wafer of method 700 includes at least front-side 582 of substrate 520. In some embodiments, the first set of diodes of method 700 includes at least diode D2' of FIGS. 5A-5C or the set of diodes D2 of FIGS. 4A-4C.

In some embodiments, operation 702 includes fabricating well 522c in substrate 520, fabricating a doped region in well 522c thereby forming anode region 530c of the first set of diodes, fabricating another doped region in well 522c thereby forming cathode region 530a in well 522c, and fabricating gate structure 530b.

In some embodiments, at least well 522a, 522b, 522c or 524a comprises p-type dopants. In some embodiments, the p-dopants include boron, aluminum or other suitable p-type dopants. In some embodiments, at least well 522a, 522b, 522c or 524a comprises an epi-layer grown over substrate 520. In some embodiments, the epi-layer is doped by adding dopants during the epitaxial process. In some embodiments, the epi-layer is doped by ion implantation after the epi-layer is formed. In some embodiments, at least well 522a, 522b, 522c or 524a is formed by doping substrate 520. In some embodiments, the doping is performed by ion implantation. In some embodiments, at least well 522a, 522b, 522c or 524a has a dopant concentration ranging from $1 \times 10^{12}$ atoms/cm$^3$ to $1 \times 10^{14}$ atoms/cm$^3$.

In some embodiments, at least fabricating cathode regions 530a of operation 702 or fabricating cathode region 504c of operation 704 (described below) includes the formation of cathode features in the substrate. In some embodiments, the formation of the cathode features includes removing a portion of the substrate to form recesses at an edge of well 522c or 522a, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as STI region 570a, 570b, 570c or 570d. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of well 522c or 522a is removed by an isotropic or an anisotropic etch process. The etch process selectively etches well 522c or 522a without etching gate structure 530b or 504b. In some embodiments, the etch process is performed using a reactive ion etch (RIE), wet etching, or other suitable techniques. In some embodiments, a semiconductor material is deposited in the recesses to form the cathode features similar to source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate 520. In some embodiments, the cathode features include epitaxially grown silicon (epi Si), silicon carbide, or silicon germanium. Cathode features of the IC device associated with gate structure 530b or 504b are in-situ doped or undoped during the epi process in some instances. When cathode features are undoped during the epi process, cathode features are doped during a subsequent process in some instances. The subsequent doping process is achieved by an ion implantation, plasma immersion ion implantation, gas and/or solid source diffusion, other suitable processes, and/or combination thereof. In some embodiments, cathode features are further exposed to annealing processes after forming cathode features and/or after the subsequent doping process.

In some embodiments, at least fabricating the gate regions of operation 702, 704 or 706 (described below) includes at least fabricating gate structure 504b, 506b, 508b, 510b or 530b. In some embodiments, at least fabricating the gate regions of operation 702, 704 or 706 (described below) includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 704 of method 700, a charging circuit is fabricated on the front-side of the wafer. In some embodiments, the charging circuit of method 700 includes at least charging circuit 504, 506 or 508. In some embodiments, the charging circuit of method 700 includes at least diode D1, NMOS transistor N3 or PMOS transistor P2.

In some embodiments, the charging circuit of method 700 includes diode D1. In these embodiments, operation 704 includes one or more of fabricating well 522a in substrate 520, fabricating a doped region in well 522a thereby forming anode region 504a of diode D2, fabricating a doped region in well 522a thereby forming cathode region 504c in well 522a, and fabricating gate structure 504b.

In some embodiments, the charging circuit of method 700 includes NMOS transistor N3. In these embodiments, operation 704 includes one or more of fabricating well 524a in substrate 520, fabricating a doped region in well 524a thereby forming source region 506a of NMOS transistor N3, fabricating a doped region in well 524a thereby forming a drain region 506c in well 524a of NMOS transistor N3, and fabricating gate structure 506b.

In some embodiments, at least source region 506a, drain region 506c, source region 510a, drain region 510c, cathode region 530a or cathode region 504c comprises n-type dopants. In some embodiments, the n-type dopants include phosphorus, arsenic or other suitable n-type dopants.

In some embodiments, the charging circuit of method 700 includes PMOS transistor P2. In these embodiments, operation 704 includes one or more of fabricating well 526a in substrate 520, fabricating a doped region in well 526a thereby forming source region 508a of PMOS transistor P2, fabricating a doped region in well 526a thereby forming a drain region 508c in well 524a of PMOS transistor P2, and fabricating gate structure 508b.

In some embodiments, at least source region 508a, drain region 508c, anode region 530c or anode region 504a comprises p-type dopants. In some embodiments, the p-dopants include boron, aluminum or other suitable p-type dopants.

In some embodiments, well 526a comprises n-type dopants. In some embodiments, the n-type dopants include phosphorus, arsenic or other suitable n-type dopants. In some embodiments, the n-type dopant concentration ranges from about $1\times10^{12}$ atoms/cm2 to about $1\times10^{14}$ atoms/cm2. In some embodiments, at least well 526a is formed by ion implantation. The power of the ion implantation ranges from about 1500 k electron volts (eV) to about 8000 k eV. In some embodiments, well 526a is epitaxially grown. In some embodiments, well 526a comprises an epi-layer grown over the surface. In some embodiments, the epi-layer is doped by adding dopants during the epitaxial process. In some embodiments, the epi-layer is doped by ion implantation after the epi-layer is formed, and has the dopant concentration described above.

In operation 706 of method 700, a discharging circuit is fabricated on the front-side of the wafer. In some embodiments, the discharging circuit of method 700 includes at least discharging circuit 210 or 510. In some embodiments, the discharging circuit of method 700 includes at least NMOS transistor N2.

In some embodiments, operation 706 includes fabricating well 522b in substrate 520, fabricating source region 510a in well 522b, fabricating drain region 510c in well 522b, and fabricating gate structure 510b.

In some embodiments, at least fabricating source regions 510a and drain regions 510c of operation 706 or fabricating source regions 506a and drain regions 506c of operation 704 is similar to the formation of cathode features in the substrate of operation 702 (described above), and similar detailed description is omitted.

In some embodiments, at least fabricating source regions 508a and drain regions 508c of operation 704 is similar to the formation of cathode features in the substrate of operation 702 (described above) with opposite dopant types, and similar detailed description is omitted.

In some embodiments, at least operation 702, 704 or 706 further includes fabricating a first signal tap region on the front-side of the wafer. In some embodiments, the first signal tap region of method 700 includes at least signal tap 550. In some embodiments, the first signal tap region of method 700 includes signal tap regions similar to signal tap 550, but formed on the front-side of the wafer of at least charging circuit 504, 506 or 508 or discharging circuit 510, and similar detailed description is omitted.

In some embodiments, signal tap 550 comprises p-type dopants. In some embodiments, the p-dopants include boron, aluminum or other suitable p-type dopants. In some embodiments, signal tap 550 is formed by a process similar to the formation of well 522a. In some embodiments, at least signal tap 550 is a heavily doped p-region.

In some embodiments, signal tap 550 comprises n-type dopants. In some embodiments, the n-type dopants include phosphorus, arsenic or other suitable n-type dopants. In some embodiments, the n-type dopant concentration ranges from about $1\times10^{12}$ atoms/cm2 to about $1\times10^{14}$ atoms/cm2. In some embodiments, signal tap 550 is formed by ion implantation. The power of the ion implantation ranges from about 1500 k electron volts (eV) to about 8000 k eV. In some embodiments, at least signal tap 550 or 352 is a heavily doped n-region.

In some embodiments, signal tap 550 is epitaxially grown. In some embodiments, signal tap 550 comprises an epi-layer grown over substrate 520. In some embodiments, the epi-layer is doped by adding dopants during the epitaxial process. In some embodiments, the epi-layer is doped by ion implantation after the epi-layer is formed. In some embodiments, signal tap 550 is formed by doping substrate 520. In some embodiments, the doping is performed by ion implantation. In some embodiments, signal tap 550 has a dopant concentration ranging from $1\times10^{12}$ atoms/cm$^3$ to $1\times10^{14}$ atoms/cm$^3$.

In operation 708 of method 700, a first set of conductive structures is fabricated on the front-side of the wafer. In some embodiments, operation 708 includes depositing the first set of conductive structures on the front-side of the wafer. In some embodiments, the first set of conductive structures of method 700 includes at least conductive structure 590 or conductive structure 592.

In some embodiments, the first set of conductive structures of method 700 are formed using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In operation 710 of method 700, wafer thinning is performed on the back-side of the wafer. In some embodiments, the back-side of the wafer of method 700 includes at least back-side 580 of substrate 520. In some embodiments, operation 710 includes a thinning process performed on the back-side of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside of the semiconductor wafer or substrate.

In operation 712 of method 700, an insulating layer is deposited on the back-side of the wafer. In some embodiments, the insulating layer of method 700 includes insulating layer 521. In some embodiments, the insulating layer 521 includes a dielectric material including oxide or another suitable insulating material. In some embodiments, the insulating layer 521 is formed by CVD, spin-on polymeric dielectric, atomic layer deposition (ALD), or other processes.

In operation 714 of method 700, portions of the insulating layer are removed from the back-side of the wafer. In some embodiments, operation 714 of method 700 uses a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process.

In operation 716 of method 700, a second set of conductive structures is deposited in at least the removed portion of the insulating layer. In some embodiments, operation 716 includes depositing the second set of conductive structures on the back-side of the wafer. In some embodiments, the second set of conductive structures of method 700 includes at least conductive structure 540, conductive structure 542 or conductive structure 544.

In some embodiments, operation 716 includes filling the openings in the insulating layer with conductive material, e.g., copper, aluminum, titanium, nickel, tungsten, or other suitable conductive material. In some embodiments, the openings are filled using CVD, PVD, sputtering, ALD or other suitable formation process.

In some embodiments, one or more of the operations of method 700 is not performed. In some embodiments, one or more of the operations of method 700 is repeated. In some embodiments, method 700 is repeated.

Other diode types or numbers of diodes, or transistor types or other numbers of transistors in at least integrated circuit 100A-100B, 200A-200B, 300A-300B, 400A-400C and 500A-500C of corresponding FIGS. 1A-1B, 2A-2B, 3A-3B, 4A-4C and 5A-5C are within the scope of the present disclosure.

Furthermore, various NMOS or PMOS transistors shown in FIGS. 2A-5C are of a particular dopant type (e.g., N-type or P-type) and are for illustration purposes. Embodiments of the disclosure are not limited to a particular transistor type, and one or more of the PMOS or NMOS transistors shown in FIGS. 2A-5C can be substituted with a corresponding transistor of a different transistor/dopant type. Similarly, the low or high logical value of various signals used in the above description is also used for illustration. Embodiments of the disclosure are not limited to a particular logical value when a signal is activated and/or deactivated. Selecting different logical values is within the scope of various embodiments. Selecting different numbers of PMOS transistors in 2A-5C is within the scope of various embodiments.

One aspect of this description relates to clamp circuit. The clamp circuit includes an electrostatic discharge (ESD) detection circuit coupled between a first node and a second node. The clamp circuit further includes a first transistor of a first type. The first transistor has a first gate coupled to at least the ESD detection circuit by a third node, a first drain coupled to the first node and a first source coupled to the second node. The clamp circuit further includes a charging circuit coupled between the second node and the third node, and configured to charge the third node during an ESD event at the second node.

Another aspect of this description relates to an ESD protection circuit. The ESD protection circuit includes a first diode coupled between a first node and an IO pad, a second diode coupled between the IO pad and a second node, an internal circuit coupled to the first diode, the second diode and the IO pad, and a clamp circuit between the first node and the second node. In some embodiments, the clamp circuit includes an ESD detection circuit coupled between the first node and the second node, a discharging circuit coupled between the first node and the second node, and coupled to the ESD detection circuit by a third node, and a charging circuit coupled between the second node and the third node, and configured to charge the third node during an ESD event at the second node.

Yet another aspect of this description relates to a method of operating an ESD circuit. The method includes receiving a first ESD voltage on a first node, the first ESD voltage being greater than a reference supply voltage of a reference voltage supply, the first ESD voltage corresponding to a first ESD event. The method further includes detecting, by a charging circuit, the first ESD event at the first node thereby causing the charging circuit to turn on and charge a gate of a first transistor of a discharging circuit, the discharging circuit being coupled between the first node and a second node, and the charging circuit being coupled between at least the first node and a third node. The method further includes discharging a first ESD current of the first ESD event in a first ESD direction from the first node to the second node by a channel of the first transistor.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clamp circuit comprising:
    an electrostatic discharge (ESD) detection circuit coupled between a first node and a second node;
    a first transistor of a first type, the first transistor comprising a first well, a first gate coupled to at least the ESD detection circuit by a third node, a first drain coupled to the first node and a first source coupled to the second node, at least the first transistor is in a semiconductor wafer, the semiconductor wafer including a front-side and a back-side opposite from the front-side, the first transistor being in the front-side of the semiconductor wafer;
    a charging circuit coupled between the second node and the third node, and configured to charge the third node during an ESD event at the second node; and
    a first conductive structure on the back-side of the semiconductor wafer, the first conductive structure being coupled to the second node, extending completely through the back-side of the semiconductor wafer, extending into the first well and is directly coupled to the first source of the first transistor.

2. The clamp circuit of claim 1, wherein the charging circuit comprises:
    a second transistor of the first type, the second transistor being in the front-side of the semiconductor wafer, and having a second gate, a second drain and a second source, the second drain being coupled to the third node, the first gate and the ESD detection circuit, and each of the second node, the second gate, the first source and the second source being coupled together.

3. The clamp circuit of claim 2, further comprising:
    a second conductive structure on the back-side of the semiconductor wafer, the second conductive structure being coupled to the second node.

4. The clamp circuit of claim 3, wherein the second conductive structure extends through the back-side of the semiconductor wafer and is coupled to the second source of the second transistor.

5. The clamp circuit of claim 4, further comprising:
    a first conductive line on the front-side of the semiconductor wafer, the first conductive line corresponds to the third node, and the first gate and the second drain are coupled together by the first conductive line.

6. The clamp circuit of claim 1, wherein the ESD detection circuit comprises:
    a resistor coupled between the first node and a fourth node;
    a capacitor coupled between the fourth node and the second node; and
    an inverter coupled to the first node, the second node, the third node, the fourth node, the first gate and the charging circuit.

7. The clamp circuit of claim 1, wherein
    the semiconductor wafer does not include a bulk, and
    a channel of the first transistor is configured to discharge an ESD current from the second node to the first node during the ESD event at the second node.

8. The clamp circuit of claim 1, wherein
    the semiconductor wafer includes a bulk, and
    a channel of the first transistor is configured to discharge an ESD current from the second node to the first node during the ESD event at the second node.

9. The clamp circuit of claim 1, wherein a top surface of the first conductive structure is below a bottom surface of the back-side of the semiconductor wafer.

10. An electrostatic discharge (ESD) protection circuit, comprising:
    a first diode coupled between a first node and an input output (IO) pad;
    a second diode coupled between the IO pad and a second node;
    an internal circuit coupled to the first diode, the second diode and the IO pad; and
    a clamp circuit between the first node and the second node, the clamp circuit comprising:
        an ESD detection circuit coupled between the first node and the second node;
        a discharging circuit coupled between the first node and the second node, and coupled to the ESD detection circuit by a third node, wherein the discharging circuit comprises:
            a first transistor of a first type, the first transistor comprising a first well and a first source in the first well, at least the first transistor is in a semiconductor wafer, the semiconductor wafer including a front-side and a back-side opposite from the front-side, the first transistor being in the front-side of the semiconductor wafer;
        a charging circuit coupled between the second node and the third node, and
    configured to charge the third node during an ESD event at the second node; and
    a first conductive structure on the back-side of the semiconductor wafer, the first conductive structure being coupled to the second node, extending into the first well, being directly coupled to the first source of the first transistor and extending completely through the back-side of the semiconductor wafer.

11. The ESD protection circuit of claim 10, wherein the first transistor further comprises a first gate and a first drain, the first gate being coupled to at least the ESD protection circuit by the third node, the first drain being coupled to the first node, and the first source being further coupled to the second node.

12. The ESD protection circuit of claim 11, wherein the charging circuit comprises:
    a second transistor of the first type, the second transistor being in the front-side of the semiconductor wafer and having a second gate, a second drain and a second source, the second drain being coupled to the first gate by the third node, and each of the second node, the second gate, the first source and the second source being coupled together.

13. The ESD protection circuit of claim 12, wherein the first conductive structure extends through the back-side of the semiconductor wafer and is coupled to the first source of the first transistor.

14. The ESD protection circuit of claim 13, further comprising:
a second conductive structure on the back-side of the semiconductor wafer, the second conductive structure being coupled to the second node.

15. The ESD protection circuit of claim 14, wherein the second conductive structure extends completely through the back-side of the semiconductor wafer and is coupled to the second source of the second transistor.

16. The ESD protection circuit of claim 15, further comprising:
a first conductive line extending in a first direction, and being on the front-side of the semiconductor wafer, the first conductive line corresponds to the third node, and the first gate and the second drain are coupled together by the first conductive line.

17. The ESD protection circuit of claim 10, wherein the ESD detection circuit comprises:
a resistor coupled between the first node and a fourth node;
a capacitor coupled between the fourth node and the second node; and
an inverter coupled to the resistor and capacitor by the fourth node, coupled to the discharging circuit and the charging circuit by at least the third node, and being coupled between the first node and the second node.

18. A method of operating an electrostatic discharge (ESD) circuit, the method comprising:
receiving a first ESD voltage on a first node, the first ESD voltage being greater than a reference supply voltage of a reference voltage supply, the first ESD voltage corresponding to a first ESD event;
detecting, by a charging circuit, the first ESD event at the first node thereby causing the charging circuit to turn on and charge a gate of a first transistor of a discharging circuit, the discharging circuit being coupled between the first node and a second node, and the charging circuit being coupled between at least the first node and a third node, at least the first transistor is in a semiconductor wafer, the semiconductor wafer including a front-side and a back-side opposite from the front-side, the first transistor being in the front-side of the semiconductor wafer, the second node being coupled to a first conductive structure on the back-side of the semiconductor wafer, the first conductive structure extends completely through the back-side of the semiconductor wafer, extends into a first source of the first transistor and is directly coupled to the first source of the first transistor; and
discharging a first ESD current of the first ESD event in a first ESD direction from the first node to the second node by a channel of the first transistor.

19. The method of claim 18, further comprising:
turning on the first transistor in response to the gate of the first transistor of the discharging circuit being charged; and
coupling the first node and the second node in response to the first transistor turning on.

20. The method of claim 18, further comprising:
receiving a second ESD voltage on the second node, the second ESD voltage being greater than a voltage of a voltage supply or an input output (IO) pad, the second ESD voltage corresponding to a second ESD event;
detecting, by an ESD detection circuit, the second ESD event at the second node thereby causing the ESD detection circuit to charge the gate of the first transistor of the discharging circuit; and
discharging a second ESD current of the second ESD event in a second ESD direction from the second node to the first node by the channel of the first transistor.

* * * * *